US007592131B2

(12) United States Patent
Kubota et al.

(10) Patent No.: US 7,592,131 B2
(45) Date of Patent: Sep. 22, 2009

(54) METHOD FOR PRODUCING FINE STRUCTURED MEMBER, METHOD FOR PRODUCING FINE HOLLOW STRUCTURED MEMBER AND METHOD FOR PRODUCING LIQUID DISCHARGE HEAD

(75) Inventors: Masahiko Kubota, Tokyo (JP); Yoshinori Tagawa, Kanagawa (JP); Wataru Hiyama, Kanagawa (JP); Tatsuya Masukawa, Kanagawa (JP); Shoji Shiba, Kanagawa (JP); Yoshiaki Kurihara, Kanagawa (JP); Hiroe Ishikura, Kanagawa (JP); Akihiko Okano, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 1162 days.

(21) Appl. No.: 10/615,289

(22) Filed: Jul. 9, 2003

(65) Prior Publication Data

US 2004/0072107 A1 Apr. 15, 2004

(30) Foreign Application Priority Data

Jul. 10, 2002 (JP) ............................ 2002-201894
Jul. 7, 2003 (JP) ............................ 2003-271624

(51) Int. Cl.
*G03F 7/40* (2006.01)
*B41J 2/05* (2006.01)
*B41J 2/16* (2006.01)

(52) U.S. Cl. ....................... 430/320; 430/311; 430/326; 430/270.1; 430/312; 430/315; 430/324; 430/330

(58) Field of Classification Search .......... 430/311-331
See application file for complete search history.

(56) References Cited

U.S. PATENT DOCUMENTS 4,087,569 A * 5/1978 Hatzakis .................... 430/327
4,330,614 A * 5/1982 Moyer et al. ................ 430/325
4,657,631 A 4/1987 Noguchi .................... 156/655
5,331,344 A 7/1994 Miyagawa et al. ............ 347/63
5,478,606 A 12/1995 Ohkuma et al. ............. 427/555

FOREIGN PATENT DOCUMENTS

EP 0 244 572 A2 11/1987

(Continued)

OTHER PUBLICATIONS

Bulgkova et al, "PMMA-based resist for a spectral range near 13 nm", Nuclear Instruments in Physics Research Section A, vol. 448, Nos. 1-2, Jun. 21, 2000, pp. 487-492.*

(Continued)

*Primary Examiner*—Cynthia Hamilton
(74) *Attorney, Agent, or Firm*—Fitzpatrick, Cella, Harper & Scinto

(57) ABSTRACT

The invention is to provide a method for producing a fine structured member and a fine hollow structure, useful for producing a liquid discharge head which is inexpensive, precise and highly reliable, also to provide a method for producing a liquid discharge head utilizing such producing method for the fine structured member and the fine hollow structure and a liquid discharge head obtained by such producing method. A positive-working photosensitive material, including a ternary polymer containing an acrylate ester as a principal component, acrylic acid for thermal crosslinking and a monomer unit for expanding a sensitivity region, is used as a material for forming the Line structured member.

28 Claims, 14 Drawing Sheets

FOREIGN PATENT DOCUMENTS

| | | | |
|---|---|---|---|
| EP | 0491560 | A2 | 6/1992 |
| EP | 0572948 | A1 | 12/1993 |
| EP | 0 734 866 | B1 | 8/1999 |
| EP | 0734866 | B1 | 8/1999 |
| EP | 0814380 | B1 | 11/2000 |
| JP | 62-258449 | | 11/1987 |
| JP | 5-124205 | | 5/1993 |
| JP | 6-45242 | | 6/1994 |
| JP | 9-15862 | | 1/1997 |
| JP | 3010089 | | 12/1999 |
| JP | 2000-326515 | | 11/2000 |
| JP | 3143307 | | 12/2000 |

OTHER PUBLICATIONS

"Fumaric Anhydride" Search from Registry File on STN Online, ACS done, 3 pages (no date).*

Claff, Chester E., "A Translators Guide to Organic Chemical Nomenclature", Translation Journal, vol. 2, No. 2, Jul. 1998, 6 pages from the world wide web.*

European Official Communication dated Jun. 29, 2007 regarding Application No. 03 015 757.2.

Foreign Office Action from counterpart application 03146787.3 dated Dec. 31, 2004, and citing above-identified EPO reference.

* cited by examiner

ABSORPTION SPECTRUM OF P(MMA-MAA-MAN)

ABSORPTION SPECTRUM OF P(MMA-MAA-GMA)

ABSORPTION SPECTRUM OF P(MMA-MAA-OM)

ABSORPTION SPECTRUM OF METHACRYLONITRILE P(MMA-MAA)

ABSORPTION SPECTRUM OF FUMARIC AN HYDRIDE P(MMA-MAA)

METHOD FOR PRODUCING FINE STRUCTURED MEMBER, METHOD FOR PRODUCING FINE HOLLOW STRUCTURED MEMBER AND METHOD FOR PRODUCING LIQUID DISCHARGE HEAD

BACKGROUND OF THE INVENTION

1. Field of the Invention

The present invention relates to a method for producing a fine structured member and a fine hollow structure, adapted for producing a liquid discharge recording head (also called liquid discharge head) for generating a droplet of a recording liquid to be employed in an ink jet recording method, a method for producing a liquid discharge recording head utilizing the aforementioned method, and a liquid discharge recording method obtained by such method. In particular, the present invention relates to a liquid flow path shape capable of stably discharging a small liquid droplet which realizes a high image quality and also capable realizing a high-speed recording, and also to a technology useful in a method for producing such head.

2. Related Background Art

A liquid discharge head, employed in an ink jet recording method (liquid discharge recording method) for executing recording by discharging a recording liquid such as ink, is generally provided with a liquid flow path, a liquid discharge generation unit provided in a part of such liquid flow path, and a fine recording liquid discharge port (also called "orifice") for discharging the liquid in the liquid flow path by the thermal energy of the liquid discharge energy generation unit. For producing such liquid discharge recording head, there is conventionally employed, for example:

(1) a method of forming a through hole for ink supply in an element substrate on which a heater for generating thermal energy for liquid discharge and a driver circuit for driving such heater are formed, then executing a pattern formation for constituting walls of the liquid flow path with a photosensitive negative-working resist, and adjoining thereto a a plate in which an ink discharge port is formed by an electroforming method or with an excimer laser; or (2) a method of preparing an element substrate prepared similarly as in the foregoing method, then separately forming a liquid flow path and an ink discharge port on a resinous film (usually polyimide being advantageously employed) coated with an adhesive material, by an excimer laser, and adjoining thus worked plate having a liquid flow path structure and the aforementioned element substrate under the application of heat and pressure.

In the ink jet head prepared by the above-described method, a distance, influencing a discharge amount, between the heater and the discharge port should be made as small as possible in order to enable discharge of a very small liquid droplet for achieving a high-quality recording. For this purpose, it is necessary to reduce a height of the liquid flow path, and to reduce the size of a discharge chamber present in a part of the liquid flow path and constituting a bubble generating chamber in contact with the liquid discharge energy generating unit and the size of the discharge port. Thus, in order to enable discharge of a small liquid droplet in the head of the above-mentioned producing method, it is required to form the liquid flow path structured member, to be laminated on the substrate, into a thin film. However, it is extremely difficult to form the liquid flow path structured member in the form of a thin film with a high precision and adhere it to the substrate.

In order to solve the problems in these producing methods, Japanese Patent Publication No. 6-45242 discloses a producing method for an ink jet head, in which a mold for the liquid flow path is patterned with a photosensitive material on a substrate bearing a liquid discharge energy generating element, then a covering resin layer is coated on the substrate so as to cover the mold pattern, then an ink discharge port communicating with the mold of the liquid flow path is formed in the covering resin layer, and then the photosensitive material used for the mold is removed (such method being hereinafter also called "mold casting method"). In such head producing method, a positive-working resist is employed for the ease of removal, as the photosensitive material. This producing method, utilizing the photolithographic technology for semiconductors, enables extremely precise and fine working in forming the liquid flow path, the discharge port etc. However, after the flow path is formed with the positive-working resist and after the positive-working resist is covered with the negative-working film resin, when the negative-working film resin is irradiated with the light corresponding to an absorption wavelength region of such negative-working film resin in order to form the discharge port, the light of such wavelength region also irradiates the pattern formed by the positive-working resist. For this reason, there may result a drawback as a result of a decomposition reaction or the like of the material constituting the pattern formed with the positive-working resist.

SUMMARY OF THE INVENTION

In consideration of the foregoing, the present inventors have precisely investigated the absorption wavelength region of the negative-working film resin constituting the nozzle and forming the orifice plate member, and the wavelength region of the light to be irradiated for forming the discharge port etc. after such resin is coated and hardened, and have found that the formation of a finer flow path is rendered possible by employing a positive-working resist responsive to an ionizing radiation of a wavelength region not overlapping with the aforementioned wavelength region as a flow path forming member and introducing a factor for expanding the sensitivity region into such positive-working resist, whereby a liquid discharge head providing a high stability in the manufacture and a further improved precision can be obtained.

An object of the present invention, made in consideration of the foregoing points, is to provide a method for producing a fine structured member and a fine hollow structure, useful for producing a liquid discharge head which is inexpensive, precise and highly reliable. Another object of the present invention is to provide a method for producing a liquid discharge head utilizing such producing method for the fine structured member and the fine hollow structured member and a liquid discharge head obtained by such method.

It is also an object of the present invention to provide a novel producing method for a liquid discharge head, capable of producing a liquid discharge head having a configuration in which the liquid flow path is finely formed precisely, exactly and with a satisfactory yield.

It is also an object of the present invention to provide a novel method for producing a liquid discharge head, capable of producing a liquid discharge head having little mutual influence with the recording liquid, and being excellent in mechanical strength and chemical resistance.

Under the aforementioned objectives, the present invention is featured by realizing a method for producing a liquid flow path (also called ink flow path in case of using ink) with a high precision, and by a finding of a satisfactory shape of the liquid flow path realizable by such method.

More specifically, the method for producing a fine structured member of the present invention useful for forming a liquid flow path of a high precision is a method for producing a fine structured member on a substrate featured by including:

a step of forming a positive-working photosensitive material on a substrate;

a step of heating the layer of the positive-working photosensitive material thereby forming a crosslinked positive-working photosensitive material layer;

a step of executing an irradiation with a ionizing radiation of a wavelength region capable of decomposing the crosslinked positive-working photosensitive material layer on a predetermined area of the crosslinked positive-working photosensitive material layer; and a step of removing, by a development, the area irradiated by the ionizing radiation of the crosslinked positive-working photosensitive material layer from the substrate, thereby obtaining a non-irradiated area by the ionizing radiation of the crosslinked positive-working photosensitive material layer as a fine structured member having a desired pattern on the substrate;

wherein the positive-working photosensitive material includes a ternary copolymer containing methyl methacrylate as a main component, methacrylic acid as a thermally crosslinkable factor and a factor for expanding a sensitivity range for the ionizing radiation.

Also the method for producing a hollow structured member of the present invention useful for forming a liquid flow path of a high precision is a method for producing a fine hollow structured member on a substrate featured by including:

a step of forming a positive-working photosensitive material on a substrate;

a step of heating the layer of the positive-working photosensitive material thereby forming a crosslinked positive-working photosensitive material layer;

a step of executing an irradiation with an ionizing radiation of a first wavelength region capable of decomposing the crosslinked positive-working photosensitive material layer on a predetermined area of the crosslinked positive-working photosensitive material layer; and a step of removing, by a development, the area irradiated by the ionizing radiation of the crosslinked positive-working photosensitive material layer from the substrate, thereby obtaining a mold pattern formed by a non-irradiated area by the ionizing radiation of the crosslinked positive-working photosensitive material layer;

a step of forming a covering resin layer, formed by a negative-working photosensitive material sensitive to a second wavelength region, in a position covering at least a part of the mold pattern on the substrate;

a step of irradiating the covering resin layer with an ionizing radiation of the second wavelength region thereby hardening the covering resin layer; and a step of removing, by dissolution, the mold pattern covered by the hardened covering resin layer from the substrate thereby obtaining a hollow structure corresponding to the mold pattern;

wherein the positive-working photosensitive material includes a ternary copolymer containing methyl methacrylate as a main component, methacrylic acid as a thermally crosslinkable factor and a factor for expanding a sensitivity range for the ionizing radiation; and the first wavelength region and the second wavelength region do not overlap mutually.

A method for producing a liquid discharge head according to the present invention is a method of forming a mold pattern with a removable resin in a portion where a liquid flow path is to be formed on a substrate on which a liquid discharge energy generating element is formed; coating and hardening a covering resin layer on the substrate so as to cover the mold pattern; and removing by dissolution the mold pattern thereby forming a liquid flow path having a hollow structure; the method being featured in that the liquid flow path is formed by the aforementioned method for producing the hollow structure.

Also a liquid discharge head according to the present invention is featured by being produced by the above-described producing method.

In the producing method for the fine structured member and the producing method for the fine hollow structure according to the present invention, as a ternary copolymer for forming a fine pattern constituting a mole for the fine structured member or the hollow structure includes a factor (monomer unit) required for crosslinking and a factor (monomer unit) for expanding the sensitivity, it is rendered possible to effective secure such predetermined shapes, thereby forming such structures precisely and stably. In particular, in forming a hollow structured member, it is possible to retain the mold pattern in stable manner in processing of the layer composed of the negative-working photosensitive material. It is also rendered possible to form a liquid flow path precisely and stably, by forming the liquid flow path as a hollow structured member in the liquid discharge head, utilizing the above-described producing methods.

The producing method for the fine structured member and the producing method for the fine hollow structure according to the present invention can be utilized, not only for producing the liquid discharge head, but advantageously for producing various fine structured members and hollow structured members.

Also by forming the mold pattern with the thermally crosslinkable positive-working photosensitive material of the present invention, there can be obtained effects of reducing or avoiding a thickness loss of the pattern caused by a developing solution at the development, and of preventing formation of a mutual dissolution layer at the interface by a solvent at the coating of the covering layer of the negative-working photosensitive material.

DETAILED DESCRIPTION OF THE PREFERRED EMBODIMENTS

Figure 1A:
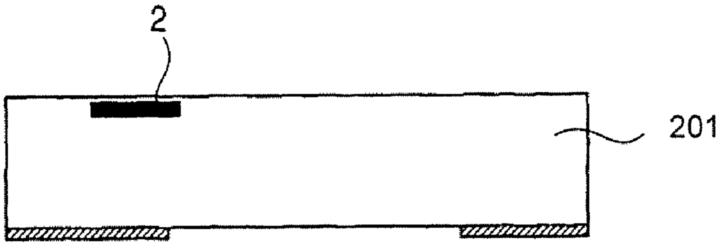
FIGS. 1A, 1B, 1C, 1D and 1E are schematic cross-sectional views of a principal part of a liquid discharge head including a discharge port, showing producing steps of a liquid discharge head of the present invention.

In the following, the present invention will be explained in detail by an example of preparation of a liquid discharge head.

The preparation of the liquid discharge head according to the present invention have advantages of an extremely easy setting of a distance between a discharge energy generating element (for example a heater) and an orifice (discharge port), which is one of the most important factors including the characteristics of the liquid discharge head, and of a positional precision between such element and the center of the orifice. More specifically, according to the present invention, the distance between the discharge energy generating element and the orifice can be selected by controlling coating thicknesses of the two photosensitive material layers, and the coating thickness of the photosensitive material layer can be reproducibly and precisely controlled by an already known thin film coating technology. Also the alignment of the discharge energy generating element and the orifice can be made optically by the photolithographic technology, and the alignment can be achieved with a drastically high precision in comparison with a method of adhering a plate having a liquid flow path structure to a substrate, employed conventionally in preparing the liquid discharge recording head.

A thermally crosslinkable positive-working photosensitive material (resist) advantageously employable in the present invention can be a material including a copolymer principally constituted of a methacrylate ester and copolymerized in a ternary system, including methacrylic acid as a crosslinkable group and a factor for expanding the sensitivity region. As the methacrylate ester unit, there can be employed a monomer unit represented by a following formula (1):

(1)

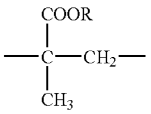

wherein R represents an alkyl group with 1 to 4 carbon atoms or a phenyl group. As a monomer for introducing such monomer unit, there can be employed, for example, methyl methacrylate, ethyl methacrylate, butyl methacrylate or phenyl methacrylate.

A copolymerization ratio of the crosslinking component is preferably optimized according to a film thickness of the positive-working resist, but methacrylic acid constituting the crosslinking factor preferably has a copolymerization amount of 2 to 30 wt. % with respect to the entire copolymer, more preferably 2 to 15 wt. %. The crosslinking under heating is realized by a dehydration condensation reaction.

Also the present inventors, as a result of intensitve investigations, have found that a photodegradable positive-working resist having a carboxylic acid anhydride structure can be particularly advantageously employed as the thermally crosslinkable resist. The photodegradable positive-working resist having a carboxylic acid anhydride structure employable in the present invention can be obtained, for example, by a radical polymerization of methacrylic anhydride or by a copolymerization of methacrylic anhydride and another monomer such as methyl methacrylate. In particular, a photodegradable positive-working resist having a carboxylic acid anhydride structure and employing methacrylic anhydride as a monomer component can provide an excellent solvent resistance by heating, without affecting the sensitivity for the photodegradation. For this reason, it does not show troubles such as dissolution or deformation at the coating of a flow path forming material to be explained later and can therefore be advantageously employed in the present invention. More specifically, the thermally crosslinkable resist can be those having a structural unit represented by following general formulas 1 and 2:

general formula 1

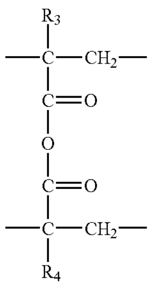

general formula 2

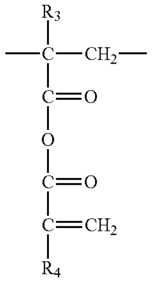

In the general formulas 1 and 2, $R_1$ to $R_4$, which may be mutually same or different, each represents a hydrogen atom or an alkyl group with 1 to 3 carbon atoms.

Further, the thermally crosslinkable resist may include a structural unit represented by a following general formula 3:

general formula 3

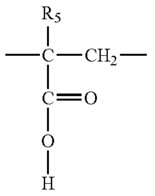

In the general formula 3, $R_5$ represents a hydrogen atom or an alkyl group with 1 to 3 carbon atoms.

As a factor for expanding the sensitivity region, there can be selectively employed a structure having a function of expanding the photosensitive wavelength region, and there can be advantageously utilized a monomer unit obtained by copolymerizing a monomer capable of expanding the sensitivity region toward a longer wavelength side as represented by following formulas (2) to (6):

(2)

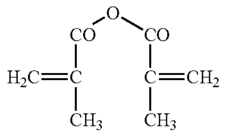

(3)

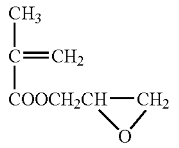

(4)

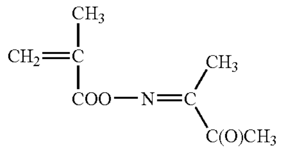

(5)

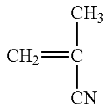

(6)

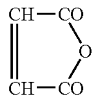

A composition ratio of such monomer unit as a factor for expanding the sensitivity region in the copolymer is preferably 5 to 30 wt. % with respect to the entire copolymer.

In case the factor for expanding the sensitivity region is methacrylic anhydride, it is preferred that the ternary copolymer includes methacrylic acid in an amount of 2 to 30 wt. % with respect to such copolymer, and is prepared by a radical polymerization of cyclizing polymerization type at a temperature of 100 to 120° C. employing an azo compound or a peroxide as a polymerization initiator.

Also in case the factor for expanding the sensitivity region is glycidyl methacrylate represented by the foregoing equation (3), it is preferred that the ternary copolymer includes methacrylic acid in an amount of 2 to 30 wt. % with respect to such copolymer, and is prepared by a radical polymerization at a temperature of 60 to 80° C. employing an azo compound or a peroxide as a polymerization initiator.

Also in case the factor for expanding the sensitivity region is methyl 3-oxyimino-2-butanone methacrylate represented by the foregoing equation (4), it is preferred that the ternary copolymer includes methacrylic acid in an amount of 2 to 30 wt. % with respect to such copolymer, and is prepared by a radical polymerization at a temperature of 60 to 80° C. employing an azo compound or a peroxide as a polymerization initiator.

Also in case the factor for expanding the sensitivity region is methacrylonitrile represented by the foregoing equation (5), it is preferred that the ternary copolymer includes methacrylic acid in an amount of 2 to 30 wt. % with respect to such copolymer, and is prepared by a radical polymerization at a temperature of 60 to 80° C. employing an azo compound or a peroxide as a polymerization initiator.

Also in case the factor for expanding the sensitivity region is fumaric anhydride (maleic anhydride) represented by the foregoing equation (6), it is preferred that the ternary copolymer includes methacrylic acid in an amount of 2 to 30 wt. % with respect to such copolymer, and is prepared by a radical polymerization at a temperature of 60 to 80° C. employing an azo compound or a peroxide as a polymerization initiator.

The ternary copolymer included in the positive-working photosensitive material of the present invention preferably have a weight-averaged molecular weight of 5,000 to 50,000. A molecular weight within such range ensures a satisfactory solubility in a solvent in a solvent coating application, and can maintain the viscosity of the solution itself within an appropriate range, thereby effectively ensuring a uniform film thickness in a spin coating process. Furthermore, a molecular weight within such range allows to improve the sensitivity to an ionizing radiation of an expanded photosensitive wavelength range, for example a wavelength region of 210 to 330 nm, thereby efficiently reducing an exposure amount for forming a desired pattern in a desired film thickness and further improving a decomposition efficiency in the irradiated area, and to further improve a development resistance to the developing liquid thereby further improving the precision of the formed pattern.

As a developing liquid for the positive-working photosensitive material, there can be employed a solvent capable of dissolving an exposed area and not easily dissolving an unexposed area, and for example methyl isobutyl ketone can be used for this purpose. However, the present inventors have found, as a result of intensive investigations, that a developing liquid containing a glycol ether having 6 or more carbon atoms and miscible with water in an arbitrary ratio, a nitrogen-containing basic organic solvent and water can be particularly advantageously employed as the developing liquid meeting the aforementioned requirements. There can be particularly advantageously employed ethylene glycol monobutyl ether and/or diethylene glycol monobutyl ether as the glycol ether, and ethanolamine and/or morpholine as the nitrogen-containing basic organic solvent, and, for example, a developing liquid of a composition disclosed in Japanese Patent Publication No. 3-10089, as a developing liquid for PMMA (polymethyl methacrylate) employed as a resist in X-ray lithography, can also be advantageously employed in the present invention. For example, there can be employed a developing liquid having following composition for the above-mentioned components:

| | |
|---|---|
| diethylene glycol monobutyl ether | 60 vol. % |
| ethanolamine | 5 vol. % |
| morpholine | 20 vol. % |
| ion-exchanged water | 15 vol. % |

In the following, there will be explained a process flow for forming a liquid flow path (also called ink flow path) according to the producing method for the liquid discharge head of the present invention.

FIGS. 1A to 1E show a most advantageous process flow employing a thermally crosslinkable positive-working resist as the positive-working resist.

FIG. 1A is a schematic cross-sectional view of a principal part showing a state in which, on a substrate 201 for example of silicon, there are formed a heat generating element 2, and a transistor for individually driving the heat generating element 2 and a circuit for a data signal processing (latter being not shown). These components are electrically connected through wirings (not shown).

Figure 2:
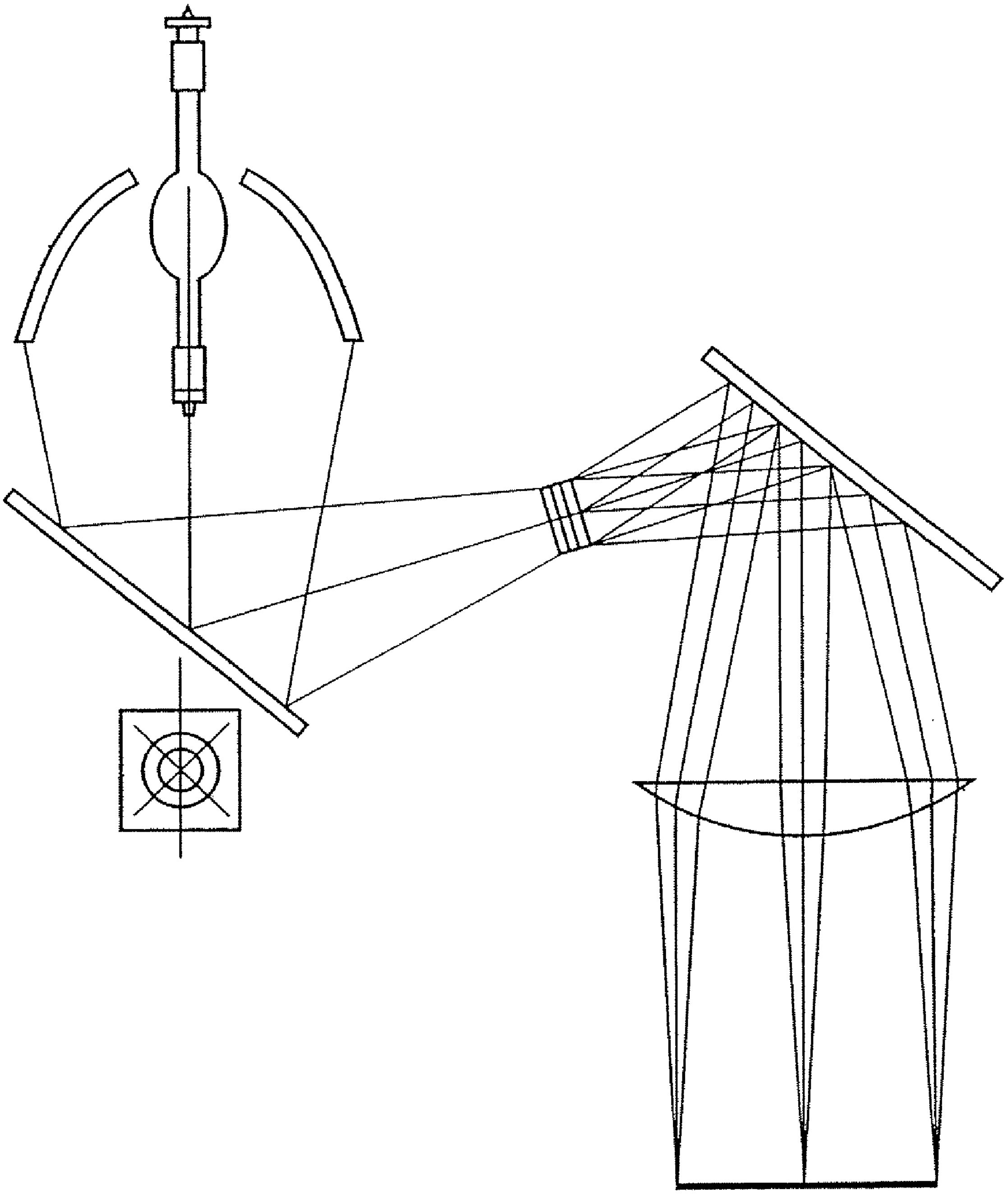
FIG. 2 is a view showing an example of an optical system for exposure.
Figure 3:
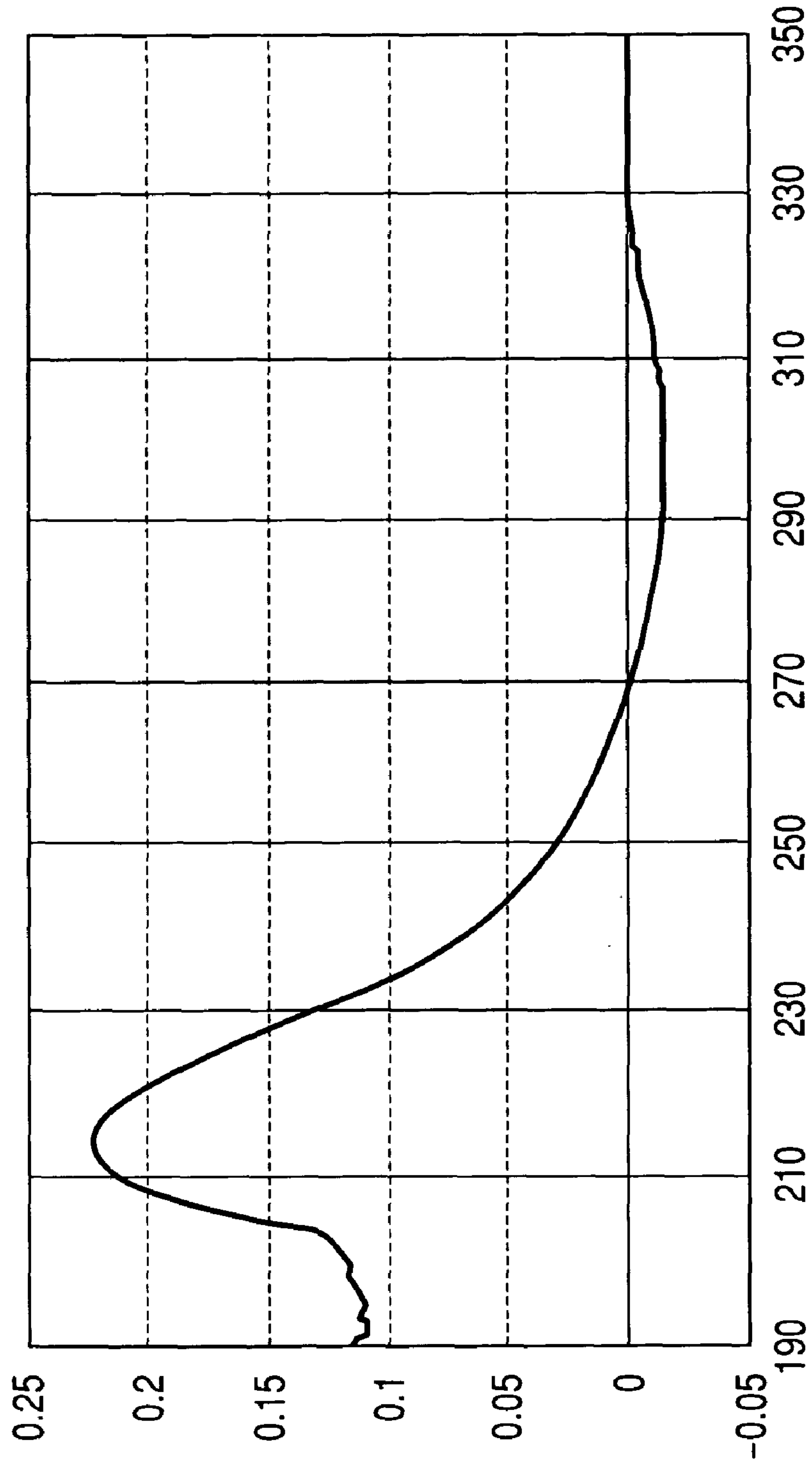
FIG. 3 is a chart showing an absorption wavelength range of an acrylate ester/acrylic acid/methacrylic anhydride copolymer (P(MMA-MA-MAN))

Then, on the substrate 201, a thermally crosslinkable positive-working resist layer is coated and baked. The coating can be achieved by an ordinary solving coating method, such as spin coating or bar coating. The baking is preferably executed at a temperature of 120 to 220° C. at which a thermal crosslinking reaction is executed and a period of 3 minutes to 2 hours, more preferably at 160 to 200° C. and 30 minutes to 1 hour. Then, an apparatus for irradiating an ultraviolet light of a short wavelength (hereinafter represented as deep-UV light) as shown in FIG. 2 is employed to irradiate the aforementioned positive-working resist layer with a light within a region of 200 to 300 nm through a mask (not shown). As the thermally crosslinkable positive-working resist has an absorption wavelength region in 200 to 280 nm as shown in FIG. 3, a decomposition reaction is accelerated by a wavelength (energy distribution) within such region.

The photosensitive wavelength region of the photosensitive material (ionizing radiation sensitive resist) employed in the present invention means a wavelength region, in which, under the irradiation of an ionizing radiation of a wavelength between an upper limit and a lower limit of such region, a polymer of a main chain cleavable type absorbs such irradiation to shift to an excited state whereby a cleavage of the main chain takes place. As a result, the polymer of a high molecular weight is reduced to a lower molecular weight thereby showing a larger solubility in the developing liquid in a developing step to be explained later.

Figure 1B:
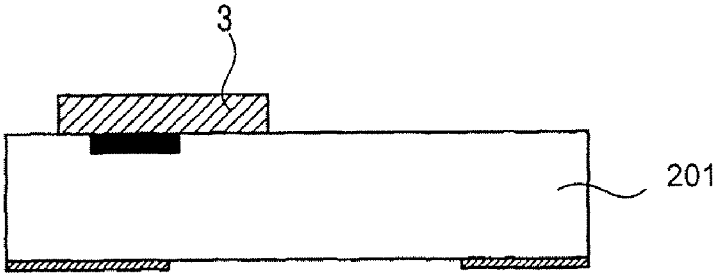

Then executed is a development of the positive-working resist layer. The development is executed preferably with methyl isobutyl ketone which is a developing liquid for such positive-working resist, but there may be employed any solvent that dissolves an exposed portion of the positive-working resist but does not dissolve an unexposed portion thereof. This development process provides, as shown in FIG. 1B, a mold pattern 3 formed by the crosslinked positive-working resist.

Then a negative-working photosensitive material is coated as a material for the liquid flow path structured member, so as to cover the mold pattern 3, thereby obtaining a negative-working photosensitive material layer 4. The coating can be achieved for example by a solvent coating method such as ordinary spin coating. In this operation, since the mold pattern 3 formed by the positive-working resist is thermally crosslinked, it is not dissolved in the coating solvent nor forms a mutual dissolution layer. Also, after a predetermined portion of the negative-working photosensitive material layer 4 is hardened, a thin water repellent layer 5 is formed if necessary. Such water repellent layer 5 can be formed by a dry film method, a spin coating method or a bar coating method. It is desirable that the water repellent layer is also formed by a material having a negative-working photosensitive property.

The material for the liquid flow path structure is, as described in Japanese Patent No. 3143307, a material principally constituted of an epoxy resin which is solid at the normal temperature and an onium salt generating a cation under a light irradiation, and having a negative-working property. At the light irradiation to the liquid flow path structure material, there is employed a photomask not exposing a portion to constitute an ink discharge port 209 to the light.

Then, the negative-working photosensitive material layer 4 is subjected to a pattern exposure for forming an ink discharge port 209 etc. For such pattern exposure there may be employed any ordinary exposure apparatus, but there is preferred an exposure apparatus capable of an irradiation in a wavelength region which coincides with the absorption wavelength region of the negative-working photosensitive material constituting the liquid flow path structure material and which does not overlap with absorption wavelength region of the positive-working resist material constituting the mold pattern. The development after the exposure is preferably executed with an aromatic solvent such as xylene. Also in case a water repellent is desired on the negative-working photosensitive material layer 4, such layer can be formed, as disclosed in Japanese Patent Application Laid-Open No. 2000-326515, by forming a negative-working photosensitive water repellent layer, followed by an exposure and a development collectively. In such operation, a photosensitive water repellent layer can be formed by a lamination.

Figure 1C:
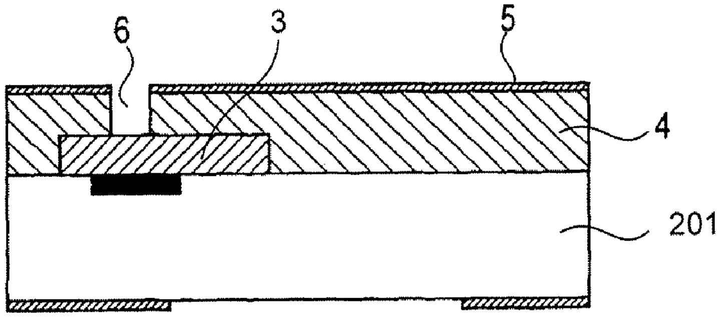
Figure 1D:
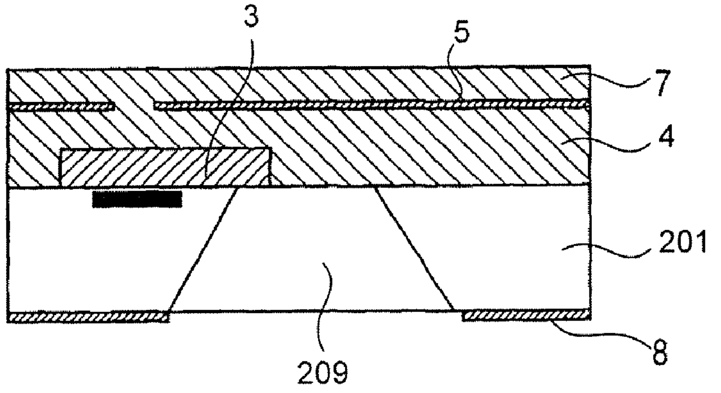

A structure shown in FIG. 1C can be obtained by the pattern exposure on the aforementioned negative-working material for the liquid flow path structure and the material for forming the water repellent layer, followed by a development with a developing liquid. Then, as shown in FIG. 1D, after a surface at the side of the discharge port 6 is protected with a resin 7 which is provided to cover the surface bearing the discharge port 6, an anisotropic etching is executed from a rear surface of the silicon substrate with an alkali solution such as of TMAH, thereby forming an ink supply aperture 9. On the rear surface of the substrate 201, a thin film 8 for example of silicon nitride is provided as a mask for limiting an etching area in the anisotropic etching. Such film 8 can be formed prior to the formation of the heat generating element 2 etc. on the substrate 201.

For such resin 7, there can be employed a resin such as cyclized isoprene that can protect the materials from etching and can be easily removed after the etching.

Figure 1E:
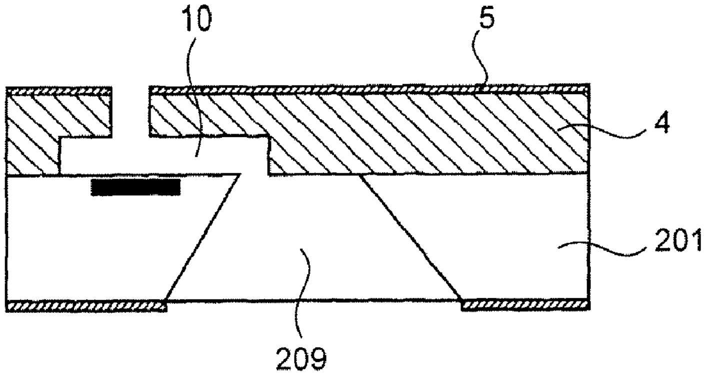

Then, after the removal of the covering resin 7 by dissolution, the mold pattern 3 is irradiated, as shown in FIG. 1E, by an ionizing radiation of a wavelength of 300 nm or less across the liquid flow path in structure member 4 constituted of a hardened portion by the pattern exposure to the negative-working photosensitive material layer. Such irradiation intends to decompose the crosslinked positive-working resist constituting the mold pattern 3 to a lower molecular weight, thereby enabling easy removal thereof.

Finally, the mold pattern 3 is removed by a solvent. In this manner there is formed a liquid flow path 10 including a discharge chamber.

The above-described steps can be applied to prepare the liquid discharge head of the present invention.

As the producing method of the present invention can be executed by a solvent coating method such as a spin coating method utilized in the semiconductor manufacturing technology, the liquid flow path can be formed with an extremely precise and stable height. Also two-dimensional shapes parallel to the plane of the substrate can be realized with a submicron precision, because of the utilization of the photolithographic technology for semiconductors.

EMBODIMENTS

In the following the present invention will be clarified in detail, with reference to the accompanying drawings whenever necessary.

Embodiment 1

FIGS. 5 to 12 illustrate an embodiment of a configuration of a liquid discharge recording head relating to the method of the present invention and an example of the producing procedure thereof.

The present embodiment illustrates a liquid discharge recording head having two orifices (discharge ports), but similar steps are naturally applicable to a high-density multi-array liquid discharge recording head having a larger number of orifices.

Figure 5:
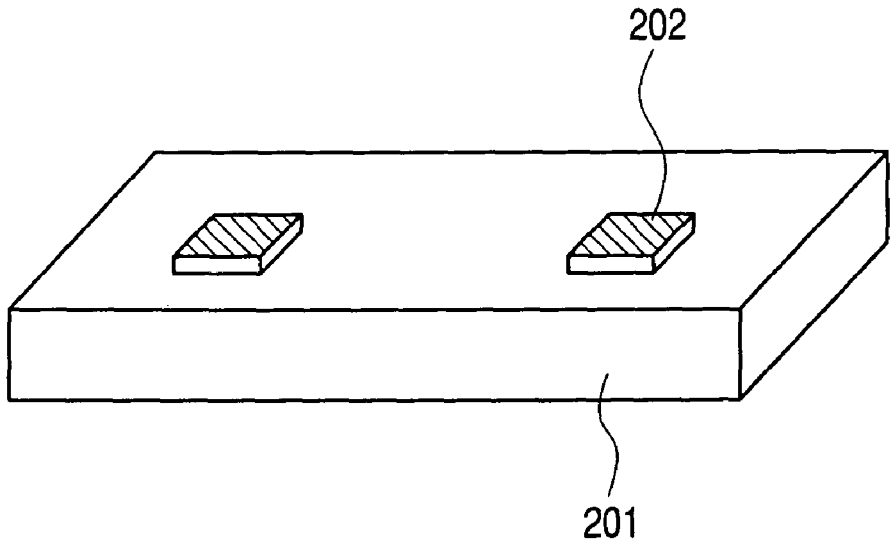
FIGS. 5, 6, 7, 8, 9, 10, 11, 12 and 13 are views showing producing steps of a liquid discharge head of the present invention.

In the present embodiment, there is employed a substrate 201 of glass, ceramics, plastics or a metal as shown in FIG. 5. FIG. 5 is a schematic perspective view of the substrate prior to the formation of a photosensitive material layer.

For such substrate 201, there can be employed, without any particular limitation in the shape or the material, any substance that can function as a part of wall members of the liquid flow path or as a supporting member for a liquid flow path structure member constituted by a photosensitive material layer to be explained later. On the above-mentioned substrate 201, there are provided a liquid discharge energy generating element 202 such as an electrothermal converting element or a piezoelectric element by a desired number of units (FIG. 5 illustrating 2 units). Such liquid discharge energy generating element 202 provides an ink liquid with a discharge energy for causing a discharge of a small liquid droplet, thereby achieving a recording. For example, in case of employing an electrothermal converting element as the liquid discharge energy generating element 202, such element heats the recording liquid in the vicinity, thereby generating a discharge energy. Also in case of employing a piezoelectric element, a discharge energy is generated by a mechanical vibration of such element.

These elements 202 are connected to electrodes (not shown) for entering control signals for operating these elements. Also, for the purpose of improving the durability of such discharge energy generating element 202, there are usually provided various functional layers such as a protective layer, and the presence of such functional layer is naturally acceptable also in the present invention.

Most commonly, silicon is employed for the substrate 201. Since a driver and a logic circuit for controlling the discharge energy generating element are produced by an ordinary semiconductor manufacturing process, the use of silicon for the substrate is advantageous. Also for forming a through hole for ink supply in the silicon substrate, there may be applied technologies utilizing a YAG laser or sand blasting. However, in case a thermally crosslinkable resist as the material of a lower layer, such resist requires an extremely high prebake temperature far exceeding the glass transition temperature of the resin, whereby the resin film tends to hang down in the through hole. It is therefore preferred that the substrate is free from the through hole at the resist coating. In such case, there may be applied an anisotropic etching of silicon with an alkali solution. In such method, an alkali-resistant mask pattern may be formed for example with silicon nitride on the rear surface of the substrate and a membrane serving as an etching stopper may be formed with a similar material on the top surface of the substrate.

Figure 6:
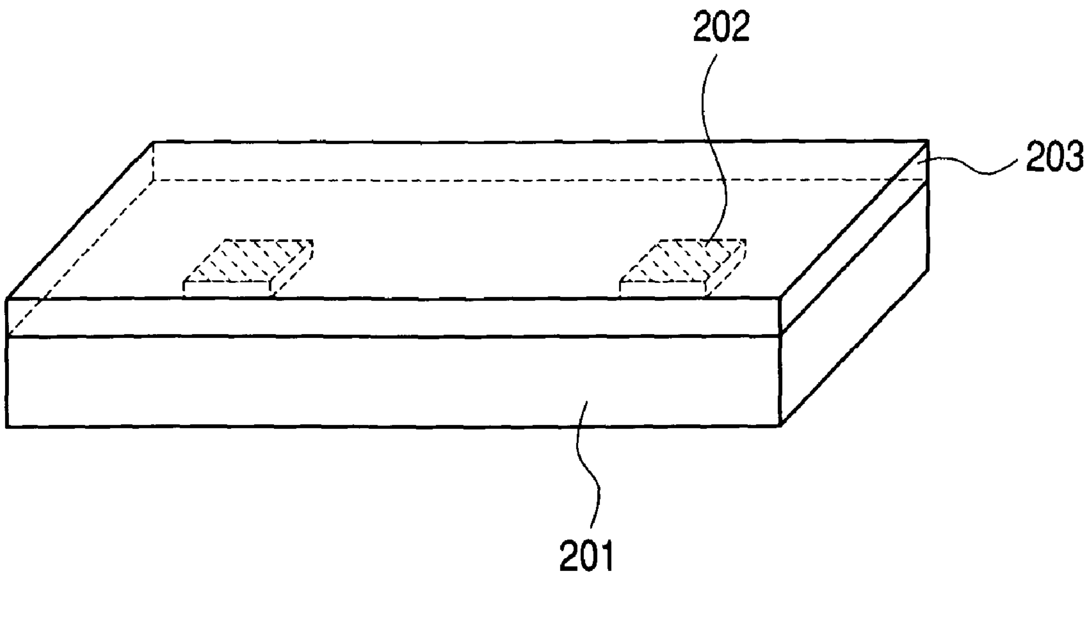

Then, as shown in FIG. 6, a crosslinkable positive-working resist layer 203 is formed on the substrate 201 bearing the liquid discharge energy generating element 202. The resist material is a methyl methacrylate/methacrylic acid/methacrylic anhydride copolymer of a ratio of 75:5:20 (weight ratio), with a weight-averaged molecular weight (Mw) of 35,000, an average molecular weight (Mn) of 12,000 and a dispersion degree (Mw/Mn) of 2.92. FIG. 3 shows an absorption spectrum of the thermally crosslinkable positive-working resist material for forming the mold member. As shown in FIG. 3, the positive-working resist material has an absorption spectrum only at a wavelength of 270 nm or shorter, so that an irradiation of a wavelength of 280 nm or longer does not cause a molecular excitation in the material itself in such energy region, whereby a decomposition reaction etc. is not accelerated. Stated differently, such positive-working resist material can cause a decomposition reaction only by an ionizing radiation of 270 nm or shorter and execute a pattern formation in a succeeding development process. A resist solution was obtained by dissolving resinous particles of the aforementioned copolymer with a solid concentration of about 30 wt. % in cyclohexanone. The coating solution has a viscosity of 630 cps. The resist solution was coated on the substrate 201 by a spin coating method, then prebaked for 3 minutes at 120° C., and further cured for 60 minutes at 200° C. in an oven to execute thermal crosslinking. The formed film had a thickness of 14 μm.

Figure 7:
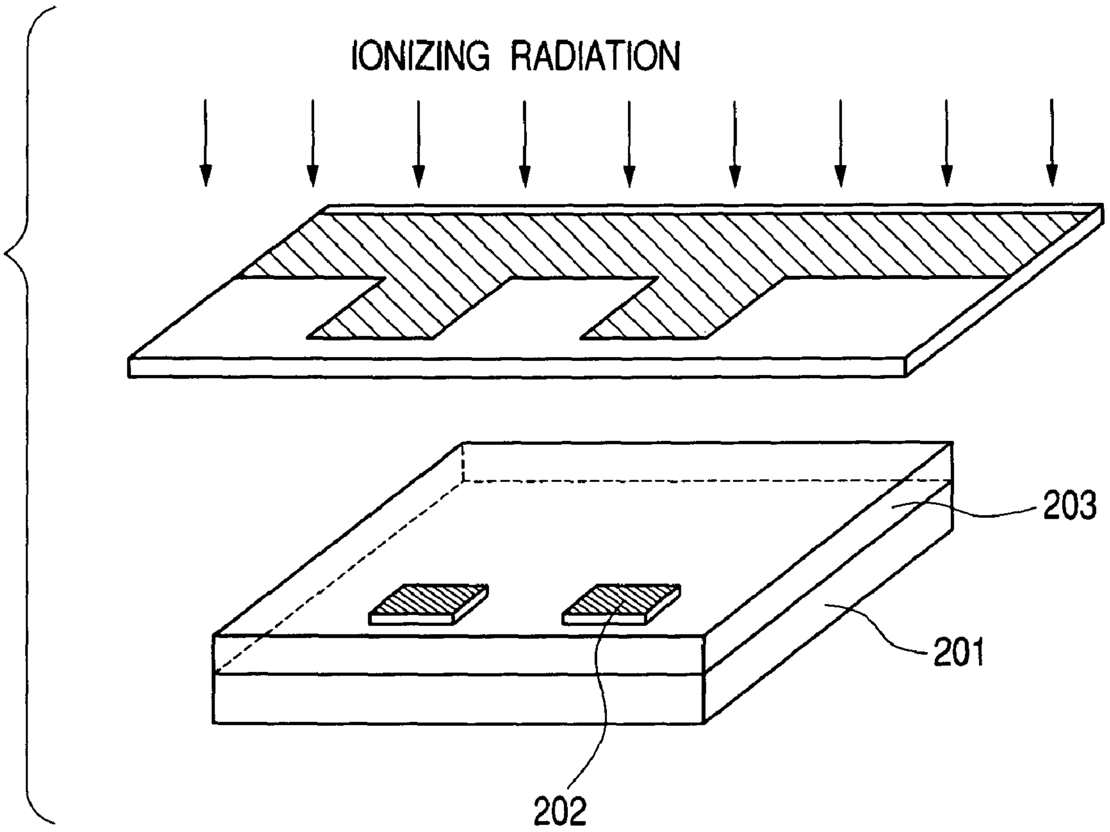
Figure 14:
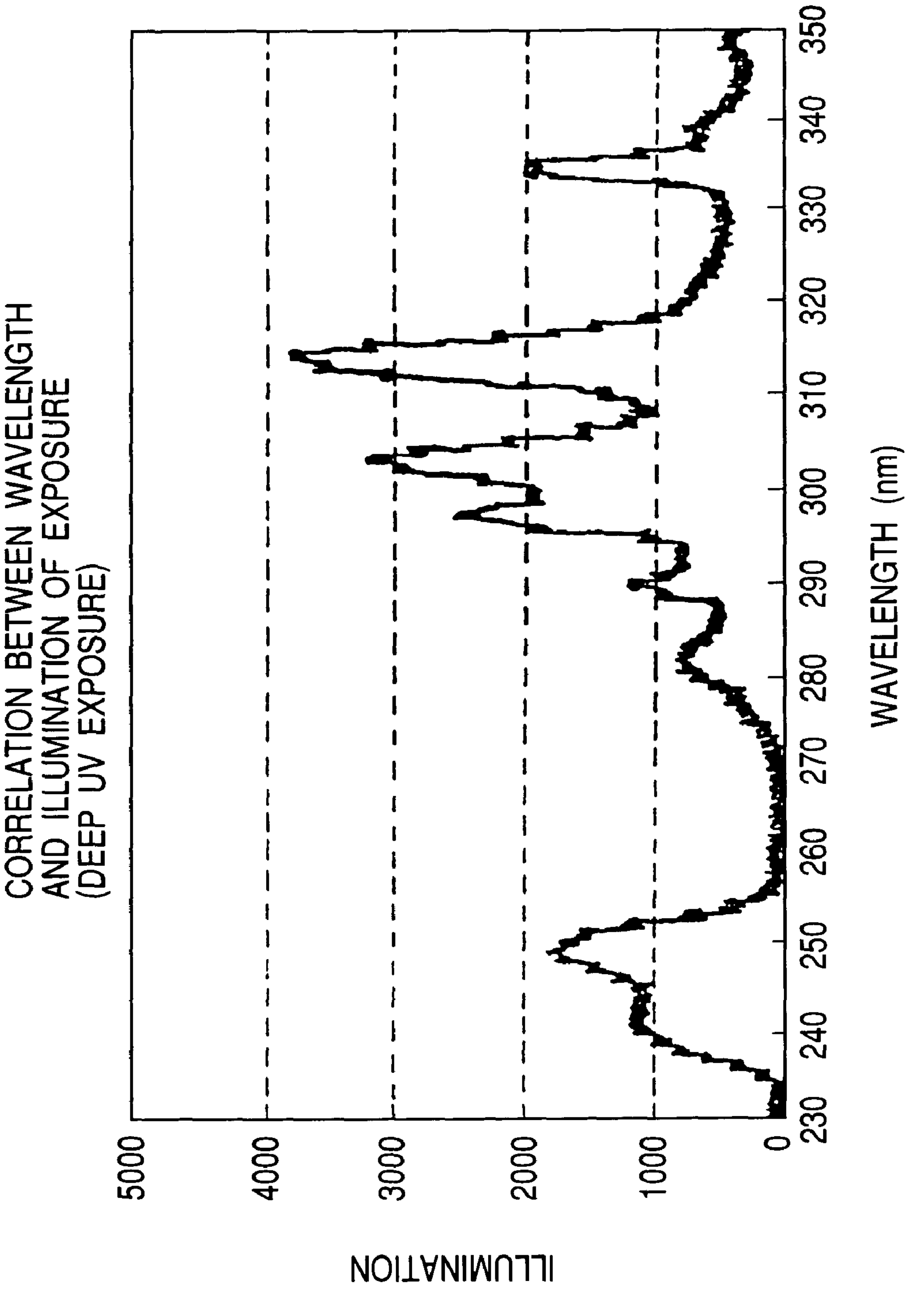
FIG. 14 is a chart showing a correlation between a wavelength and an illumination intensity of an exposure machine.

Then, as shown in FIG. 7, the thermally crosslinking positive-working resist layer 203 was subjected to a patterning (exposure and development). An exposure was executed with an exposure apparatus shown in FIG. 2, and in a region of 210 to 330 nm which is a first wavelength region shown in FIG. 14. The exposure amount was 60 J/cm$^2$, and a development was executed with methyl isobutyl ketone. A light of 280 nm or longer is contained in the irradiation, but does not contribute to the decomposition reaction of the positive-working resist layer as explained in the foregoing. Optimally, there may be employed a cutting filter capable of intercepting the light of 260 nm or longer as shown in FIG. 2. The exposure with the ionizing radiation was executed with a photomask bearing a pattern to be left on the thermally crosslinking positive-working resist. In case of employing an exposure apparatus having a projection optical system without an influence of a diffracted light, it is naturally unnecessary to consider a line thinning in the mask design.

Figure 8:
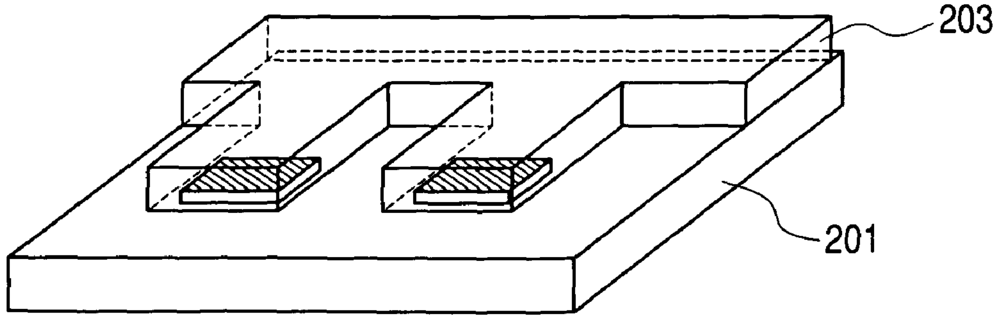

Then, as shown in FIG. 8, a layer of a liquid flow path structure material 207 is formed so as to cover the patterned and thermally crosslinked positive-working resist layer 203. A coating solution for forming this layer was prepared by dissolving 50 parts of EHPE-3150 commercially supplied by Daicel Chemical Industries Ltd., 1 part of a cationic photopolymerization initiator commercially supplied by Asahi Denka Co., and 2.5 parts of a silane coupling agent A-187 commercially supplied bt Nihon Unicar Co. in 50 parts of xylene employed as a coating solvent.

Figure 4:
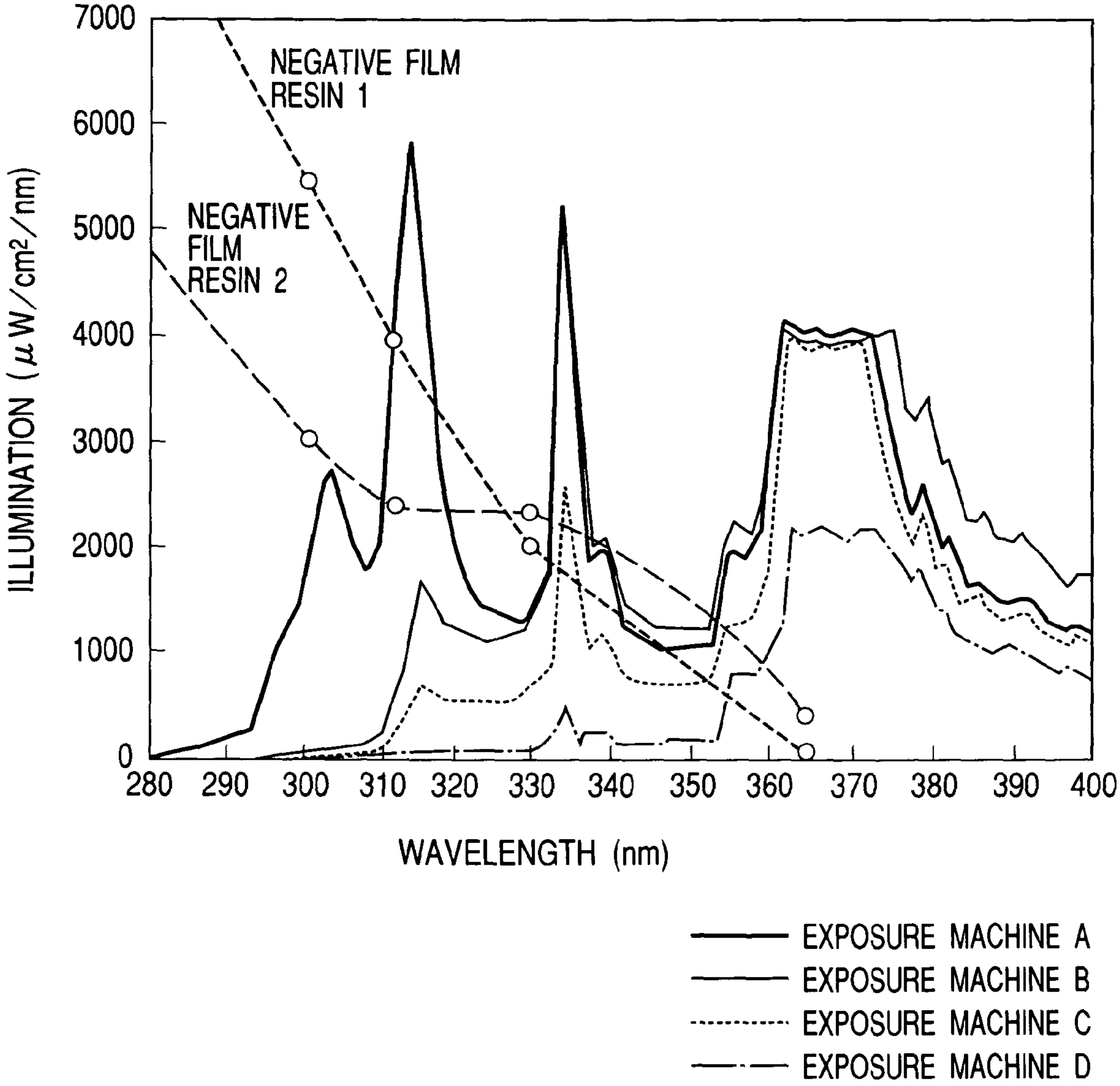
FIG. 4 is a chart showing a relationship of various absorption wavelength regions.
Figure 9:
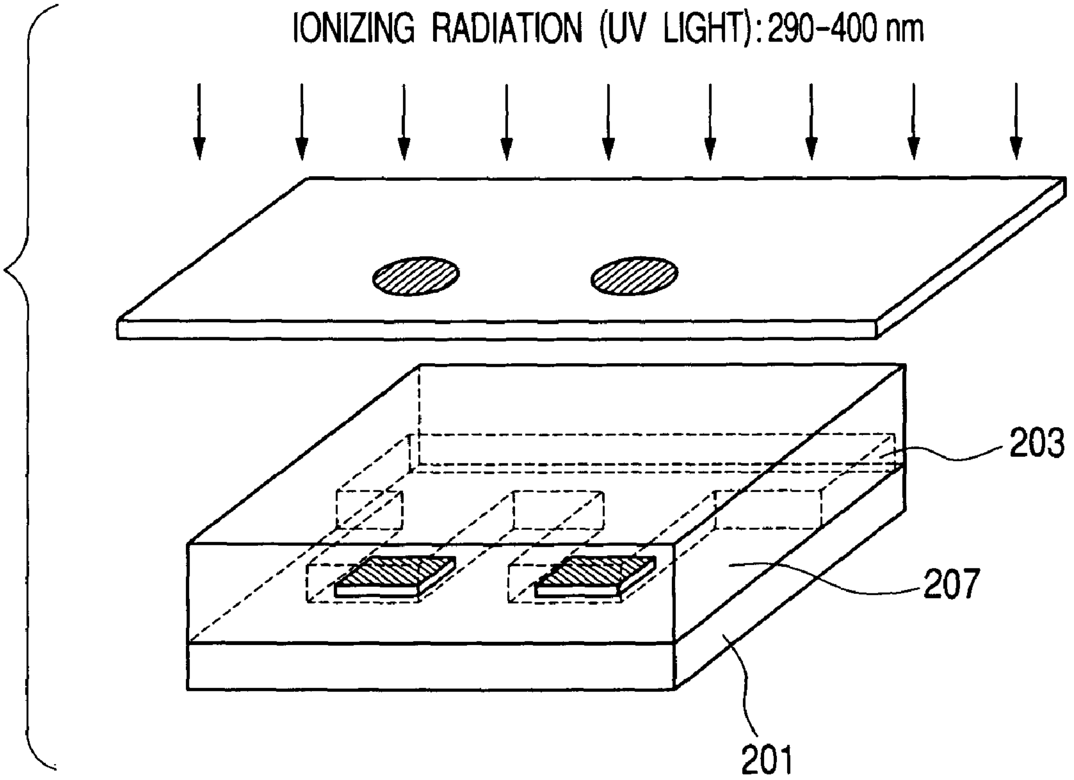

The coating was executed by spin coating, and the prebake was executed for 3 minutes at 90° C. on a hot plate. Then, as shown in FIG. 9, a pattern exposure and a development of an ink discharge port 209 are executed on the liquid flow path structure material 207. Such pattern exposure can be executed with any ordinary exposure apparatus capable of irradiation of a UV light. The irradiating light is required to have a wavelength region of 290 nm or longer, which does not overlap with the sensitive wavelength region of the mold pattern already formed by the crosslinking positive-working resist and is within the sensitive wavelength region of the negative-working film resin but which is not limited in the upper limit. At the exposure, there was employed a mask which does not expose a portion for forming the ink discharge port to the light. The exposure was executed with a Canon mask aligner MPA-600 Super, with an exposure amount of 500 mJ/cm$^2$. As shown in FIG. 4, this exposure machine emits a UV light of a region of 290 to 400 nm, in which the aforementioned negative-working film resin has a sensitivity. In case of using the above-mentioned exposure machine, the UV light of the region of 290 to 400 nm also irradiates, as shown in FIG. 9, the pattern of the positive-working resist layer formed in the step shown in FIG. 8, through the negative-working film resin. Since the thermally crosslinkable positive-working resist material employed in the present invention is sensitive only to the deep-UV light of 270 nm or shorter, the decomposition reaction of the material is not accelerated in this step.

Figure 10:
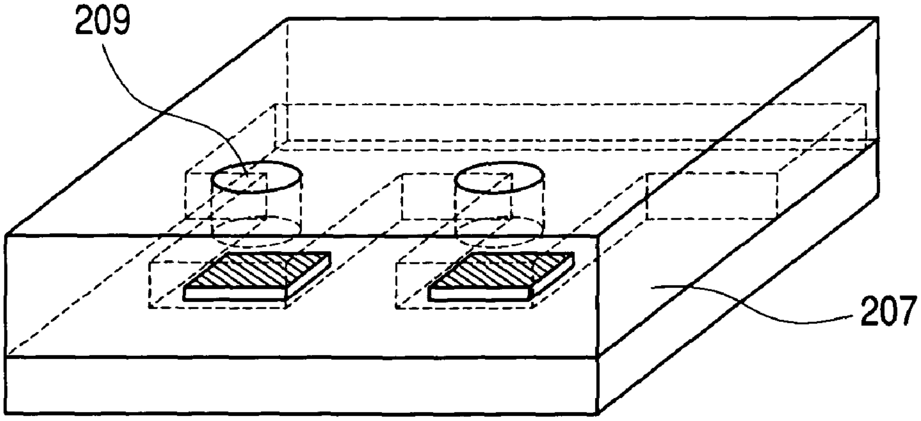

Thereafter the development was executed by immersion for 60 seconds in xylene, as shown in FIG. 10. Then a bake was executed for 1 hour at 100° C. to enhance the adhesion of the liquid flow path structure material.

Thereafter, though not illustrated, cyclized isoprene was coated on the liquid flow path structure material layer, in order to protect such layer from an alkali solution. For this purpose there was employed a material commercially supplied by Tokyo Oka Industries Co. Then the silicon substrate was immersed in a 22 wt. % solution of tetramethyl ammonium hydride (TMAH) for 14.5 hours at 83° C. to form a through hole (not shown) for ink supply. Silicon nitride employed as a mask and a membrane for forming the ink supply hole was patterned in advance on the silicon substrate. After such anisotropic etching, the silicon substrate was mounted, with the rear surface upward, on a dry etching apparatus and the membrane was removed employed a $CF_4$ etchant mixed with 5% of oxygen. Then the silicon substrate was immersed in xylene to remove OBC.

Figure 11:
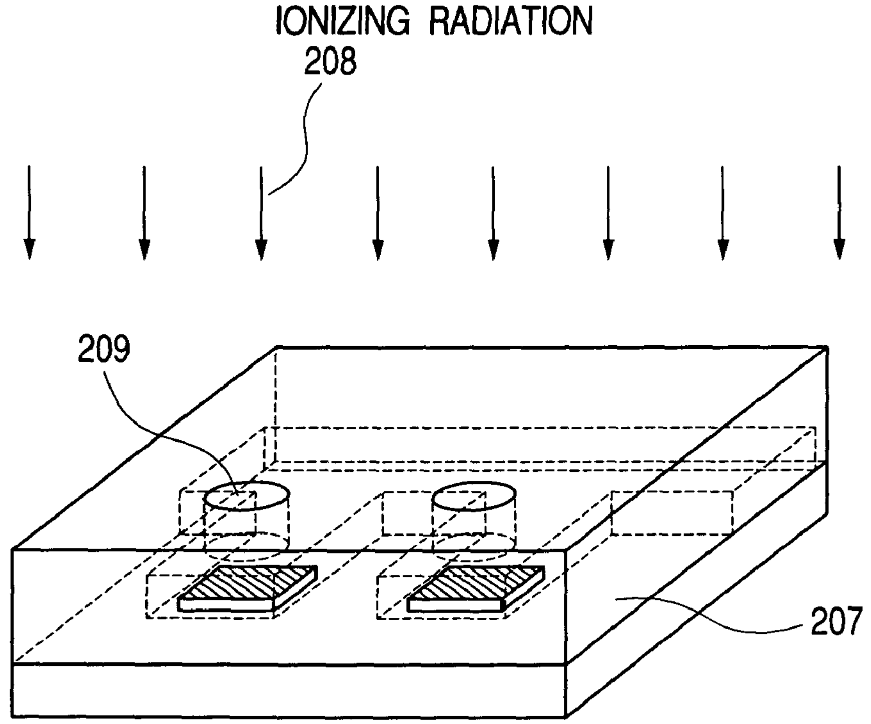

Then, as shown in FIG. 11, a flush irradiation of an ionizing radiation 208 of a region of 210 to 330 nm was made with a low-pressure mercury lamp toward the liquid flow path structure material 207, thereby decomposing the mold pattern constituted of the thermally crosslinking positive-working resist. The amount of irradiation was 81 $J/cm^2$.

Figure 12:
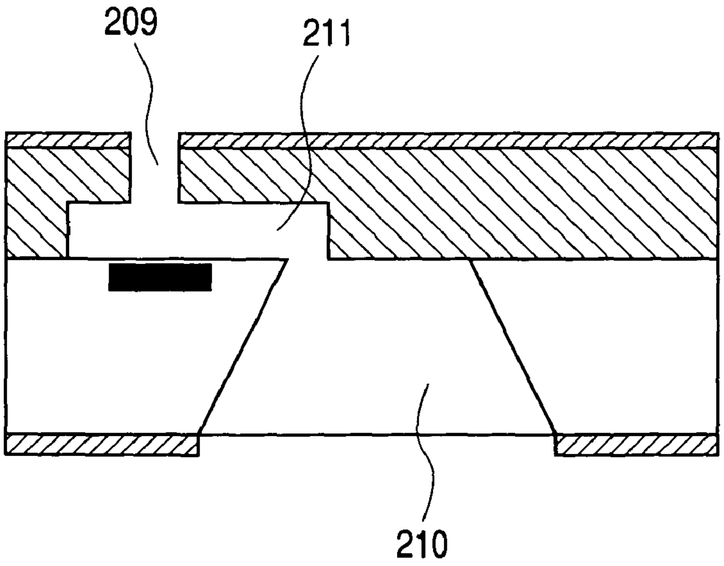

Thereafter the substrate 201 was immersed in methyl lactate to collectively remove the mold pattern, as shown in a vertical cross-section in FIG. 12. This operation was executed in a megasonic tank of 200 MHz to shorten the dissolving time. In this manner there is obtained a liquid flow path 211 including a discharge chamber, and there is prepared an ink discharge element of a configuration in which the ink is guided from the ink supply hole 210 through each liquid flow path 211 to each discharge chamber, and is discharged from the discharge port 209 by the function of the heater.

Embodiment 2

Figure 15:
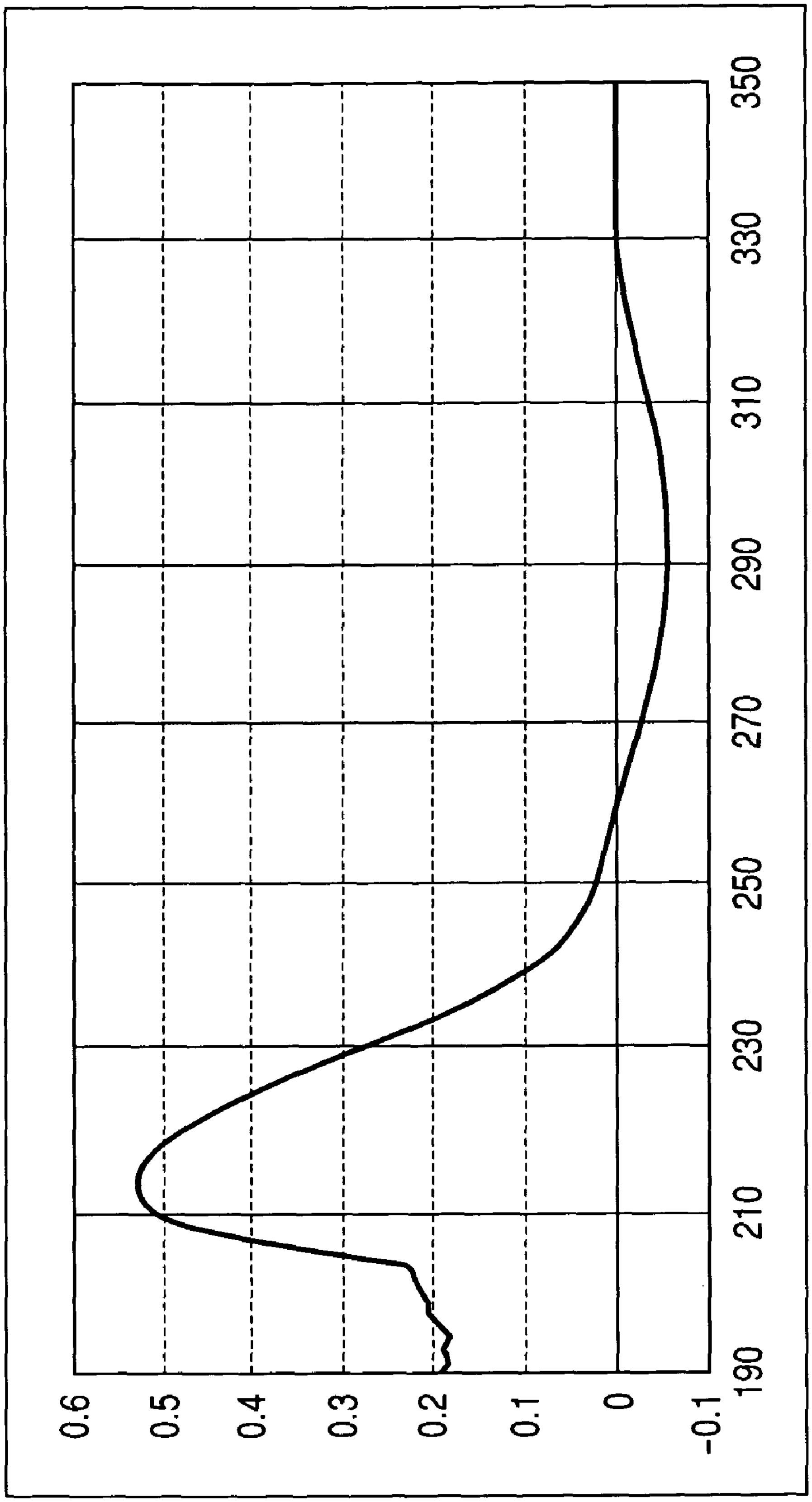
FIG. 15 is a chart showing an absorption wavelength range of methyl methacrylate/methacrylic acid/glycidyl methacrylate copolymer (P(MMA-MAA-GMA))

In a manner similar to the first embodiment, a crosslinkable positive-working resist layer 203 is formed on a substrate 201 bearing a liquid discharge energy generating element 202 as shown in FIG. 6. The material is a methyl methacrylate/methacrylic acid/glycidyl methacrylate copolymer of a ratio of 80:5:15, with a weight-averaged molecular weight (Mw) of 34,000, an average molecular weight (Mn) of 11,000 and a dispersion degree (Mw/Mn) of 3.09. FIG. 15 shows an absorption spectrum of the thermally crosslinkable positive-working resist material for forming the mold member. As shown in FIG. 15, the positive-working resist material has an absorption spectrum only at a wavelength of 260 nm or shorter, so that an irradiation of a wavelength of 270 nm or longer does not cause a molecular excitation in the material itself in such energy region, whereby a decomposition reaction etc. is not accelerated. Stated differently, such positive-working resist material can cause a decomposition reaction only by an ionizing radiation of 260 nm or shorter and execute a pattern formation in a succeeding development process. A resist solution was obtained by dissolving resinous particles of the aforementioned copolymer with a solid concentration of about 30 wt. % in cyclohexanone. The coating solution has a viscosity of 630 cps. The resist solution was coated on the substrate 201 by a spin coating method, then prebaked for 3 minutes at 120° C., and further cured for 60 minutes at 200° C. in an oven to execute thermal crosslinking. The formed film had a thickness of 14 μm.

Thereafter there is prepared a liquid flow path 211 including a discharge chamber in a similar manner as in the first embodiment, whereby obtained is an ink discharge element of a configuration in which the ink is guided from the ink supply hole 210 through each liquid flow path 211 to each discharge chamber, and is discharged from the discharge port 209 by the function of the heater.

Embodiment 3

Figure 16:
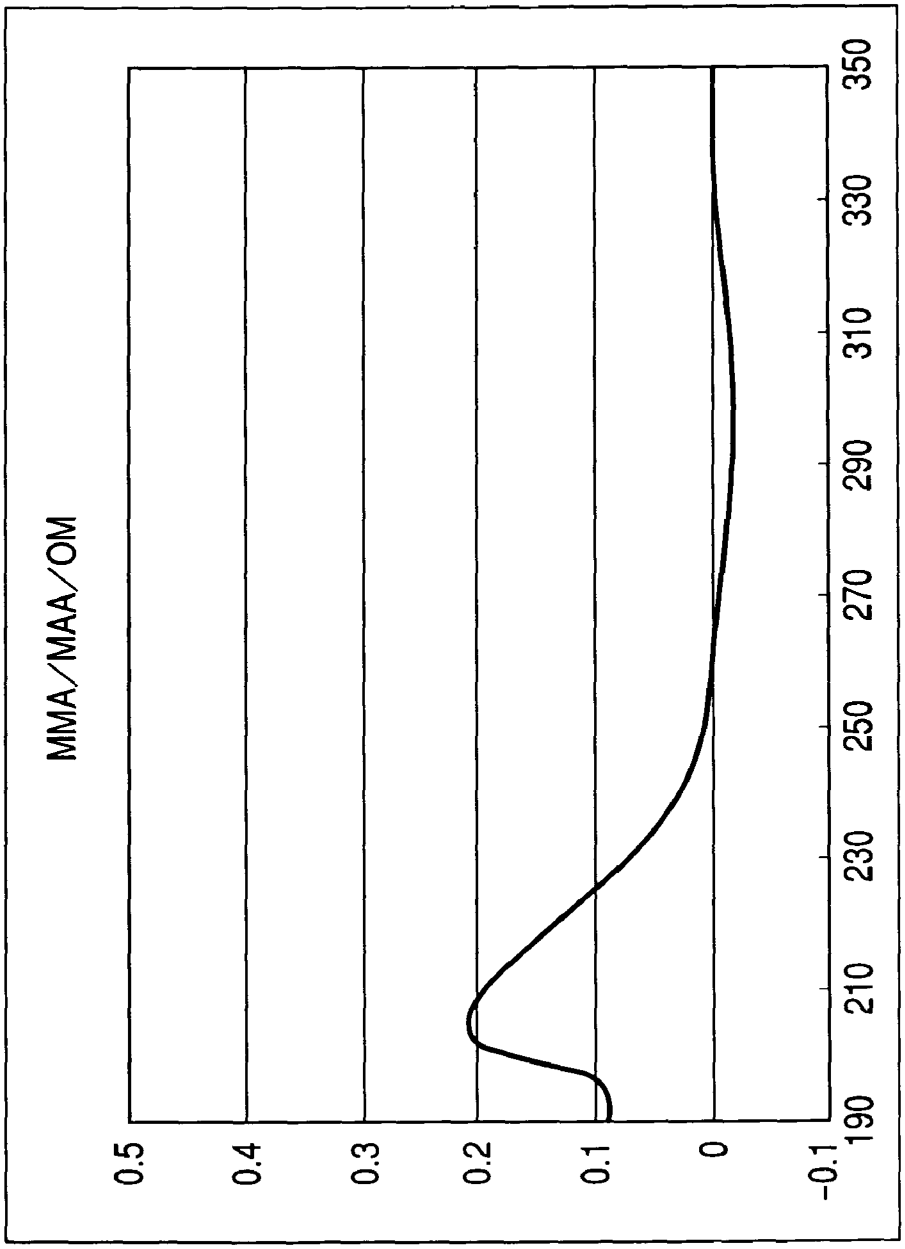
FIG. 16 is a chart showing an absorption wavelength range of methyl methacrylate/methacrylic acid/methyl 3-oxy-imino-2-butanone methacrylate copolymer (P(MMA-MAA-OM))

In a manner similar to the first embodiment, a crosslinkable positive-working resist layer 203 is formed on a substrate 201 bearing a liquid discharge energy generating element 202 as shown in FIG. 6. The material is a methyl methacrylate/methacrylic acid/methyl 3-oxyimino-2-butanone methacrylate copolymer of a ratio of 85:5:10, with a weight-averaged molecular weight (Mw) of 35,000, an average molecular weight (Mn) of 13,000 and a dispersion degree (Mw/Mn) of 2.69. FIG. 16 shows an absorption spectrum of the thermally crosslinkable positive-working resist material for forming the mold member. As shown in FIG. 16, the positive-working resist material has an absorption spectrum only at a wavelength of 260 nm or shorter, so that an irradiation of a wavelength of 270 nm or longer does not cause a molecular excitation in the material itself in such energy region, whereby a decomposition reaction etc. is not accelerated. Stated differently, such positive-working resist material can cause a decomposition reaction only by an ionizing radiation of 260 nm or shorter and execute a pattern formation in a succeeding development process. A resist solution was obtained by dissolving resinous particles of the aforementioned copolymer with a solid concentration of about 30 wt. % in cyclohexanone. The coating solution has a viscosity of 630 cps. The resist solution was coated on the substrate 201 by a spin coating method, then prebaked for 3 minutes at 120° C., and further cured for 60 minutes at 200° C. in an oven to execute thermal crosslinking. The formed film had a thickness of 14 μm.

Thereafter there is prepared a liquid flow path 211 including a discharge chamber in a similar manner as in the first embodiment, whereby obtained is an ink discharge element of a configuration in which the ink is guided from the ink supply hole 210 through each liquid flow path 211 to each discharge chamber, and is discharged from the discharge port 209 by the function of the heater.

Embodiment 4

Figure 17:
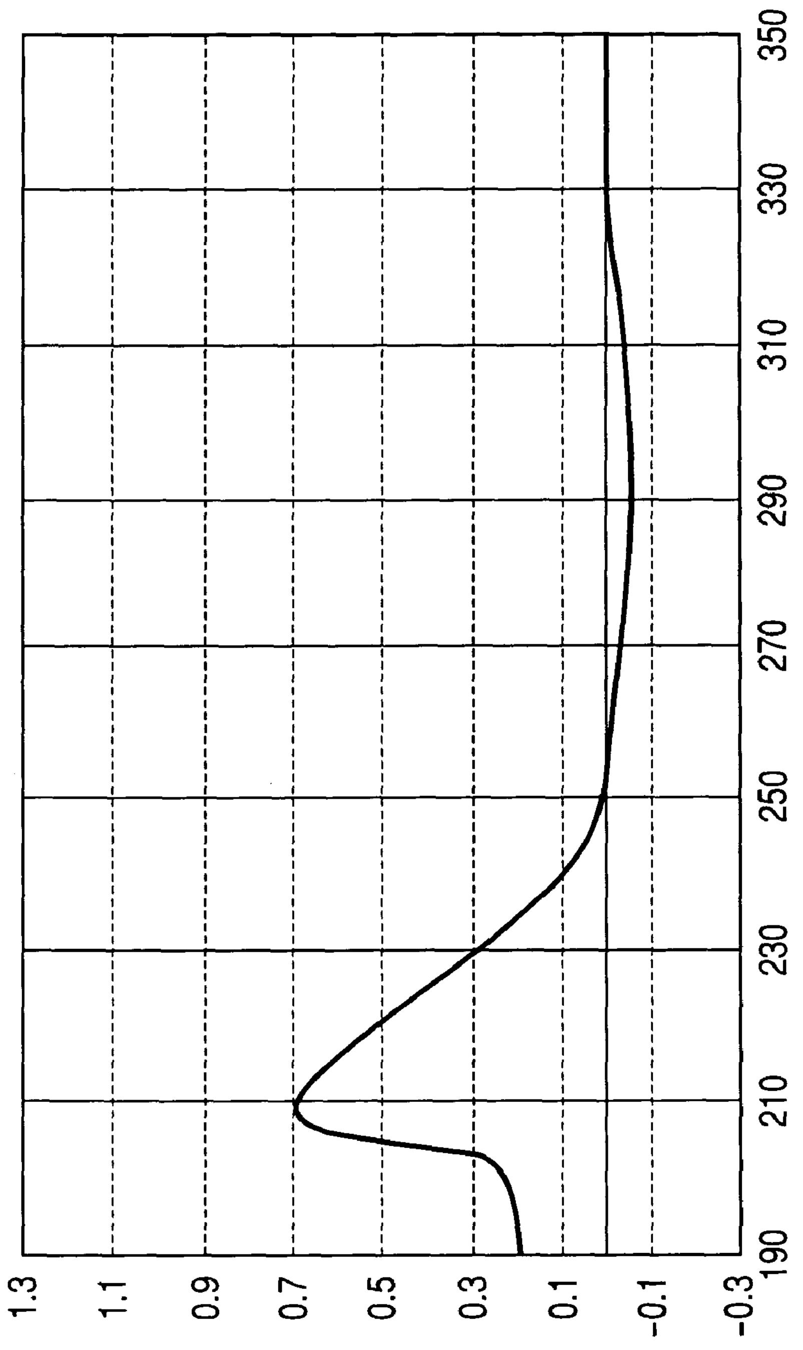
FIG. 17 is a chart showing an absorption wavelength range of methyl methacrylate/methacrylic acid/methacrylonitrile copolymer (P(MMA-MAA-methacrylonitrile))

In a manner similar to the first embodiment, a crosslinkable positive-working resist layer 203 is formed on a substrate 201 bearing a liquid discharge energy generating element 202. The material is a methyl methacrylate/methacrylic acid/methacryonitrile copolymer of a ratio of 75:5:20, with a weight-averaged molecular weight (Mw) of 30,000, an average molecular weight (Mn) of 16,000 and a dispersion degree (Mw/Mn) of 1.88. FIG. 17 shows an absorption spectrum of the thermally crosslinkable positive-working resist material for forming the mold member. As shown in FIG. 17, the positive-working resist material has an absorption spectrum only at a wavelength of 260 nm or shorter, so that an irradiation of a wavelength of 270 nm or longer does not cause a molecular excitation in the material itself in such energy region, whereby a decomposition reaction etc. is not accelerated. Stated differently, such positive-working resist material can cause a decomposition reaction only by an ionizing radiation of 260 nm or shorter and execute a pattern formation in a succeeding development process. A resist solution was obtained by dissolving resinous particles of the aforementioned copolymer with a solid concentration of about 30 wt. % in cyclohexanone. The coating solution has a viscosity of 630 cps. The resist solution was coated on the substrate 201 by a spin coating method, then prebaked for 3 minutes at 120° C., and further cured for 60 minutes at 200° C. in an oven to execute thermal crosslinking. The formed film had a thickness of 14 μm.

Thereafter there is prepared a liquid flow path 211 including a discharge chamber in a similar manner as in the first embodiment, whereby obtained is an ink discharge element of a configuration in which the ink is guided from the ink supply hole 210 through each liquid flow path 211 to each discharge chamber, and is discharged from the discharge port 209 by the function of the heater.

Embodiment 5

Figure 18:
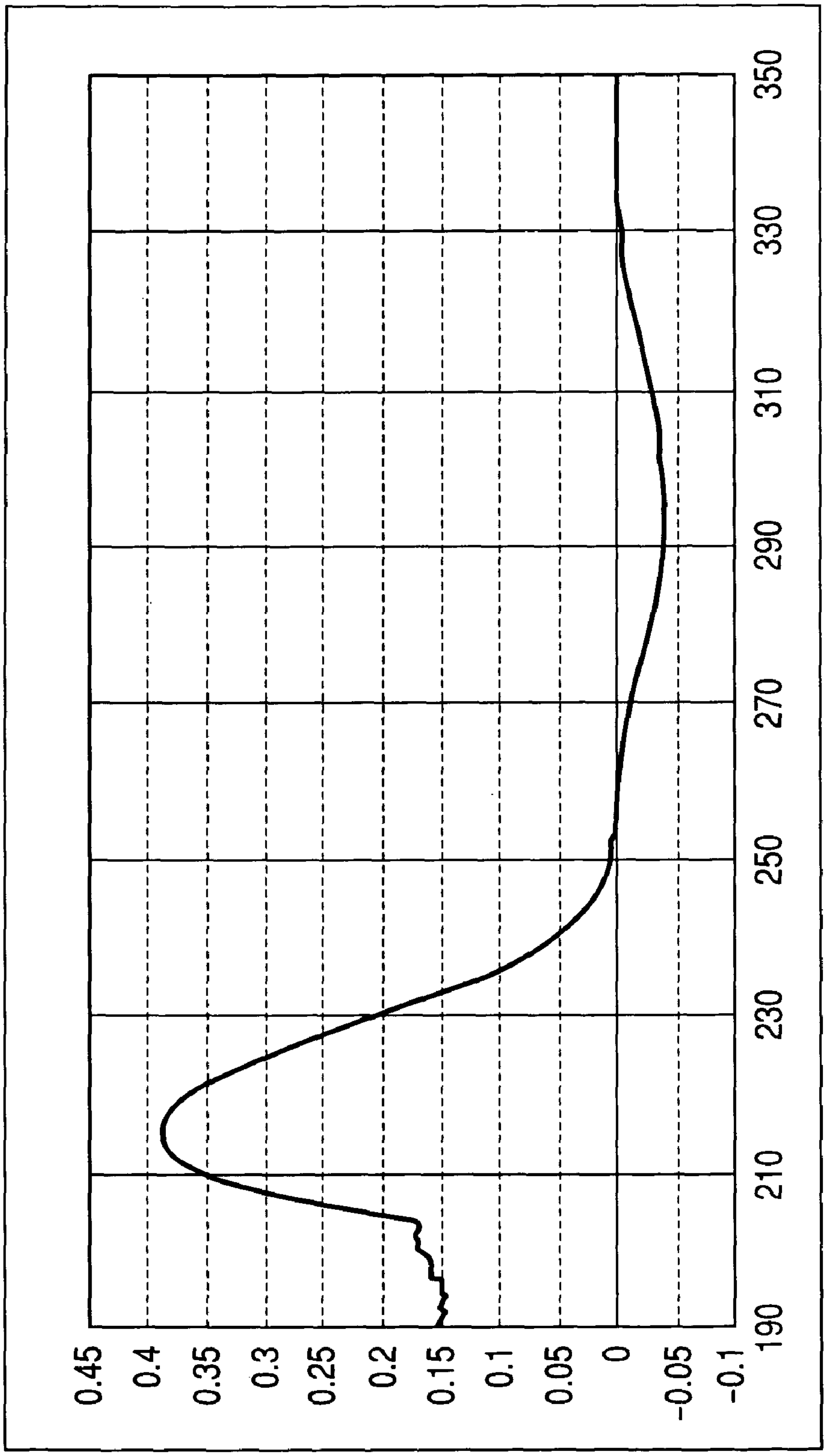
FIG. 18 is a chart showing an absorption wavelength range of methyl methacrylate/methacrylic acid/fumaric anhydride copolymer (P(MMA-MAA-fumaric anhydride)).

In a manner similar to the first embodiment, a crosslinkable positive-working resist layer 203 is formed on a substrate 201 bearing a liquid discharge energy generating element 202. The material is a methyl methacrylate/methacrylic acid/fumaric anhydride copolymer of a ratio of 80:5:15, with a weight-averaged molecular weight (Mw) of 30,000, an average molecular weight (Mn) of 14,000 and a dispersion degree (Mw/Mn) of 2.14. FIG. 18 shows an absorption spectrum of the thermally crosslinkable positive-working resist material for forming the mold member. As shown in FIG. 18, the positive-working resist material has an absorption spectrum only at a wavelength of 260 nm or shorter, so that an irradiation of a wavelength of 270 nm or longer does not cause a molecular excitation in the material itself in such energy region, whereby a decomposition reaction etc. is not accelerated. Stated differently, such positive-working resist material can cause a decomposition reaction only by an ionizing radiation of 260 nm or shorter and execute a pattern formation in a succeeding development process. A resist solution was obtained by dissolving resinous particles of the aforementioned copolymer with a solid concentration of about 30 wt. % in cyclohexanone. The coating solution has a viscosity of 630 cps. The resist solution was coated on the substrate 201 by a spin coating method, then prebaked for 3 minutes at 120° C., and further cured for 60 minutes at 200° C. in an oven to execute thermal crosslinking. The formed film had a thickness of 14 μm.

Thereafter there is prepared a liquid flow path 211 including a discharge chamber in a similar manner as in the first embodiment, whereby obtained is an ink discharge element of a configuration in which the ink is guided from the ink supply hole 210 through each liquid flow path 211 to each discharge chamber, and is discharged from the discharge port 209 by the function of the heater.

Figure 13:
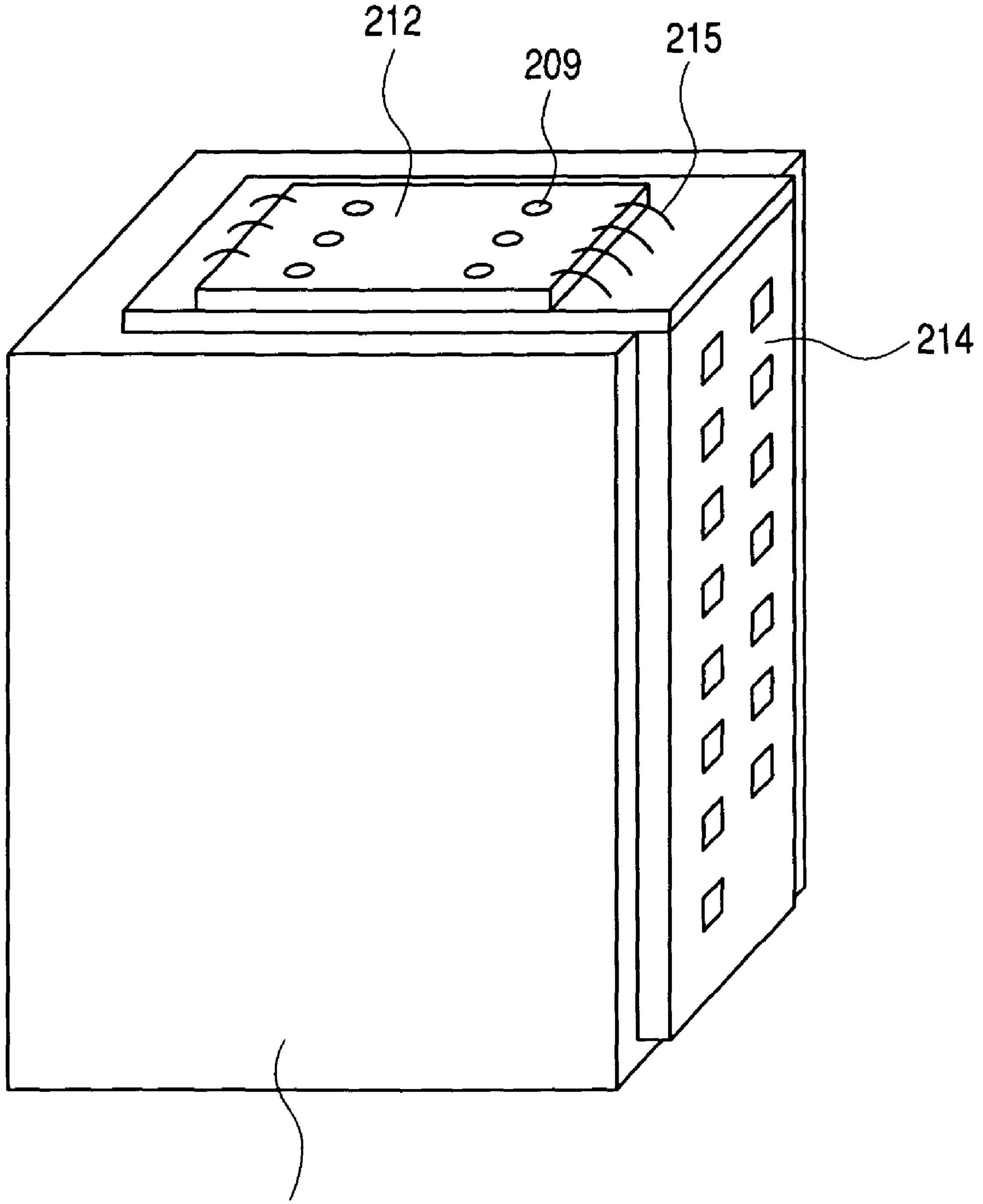

The discharge element thus prepared was assembled in an ink jet head unit of a configuration shown in FIG. 13, and was subjected an evaluation of discharge and recording, in which a satisfactory image recording was possible. In such ink jet head unit, as shown in FIG. 13, a TAB film 214 for exchanging recording signals with a main body of the recording apparatus is provided on an external surface of a supporting member which detachably supports an ink tank 213, and an ink discharge element 212 is connected with electric wirings on the TAB film 214 by electric connecting leads 215.

Embodiment 6

At first, a substrate 201 is prepared. Most commonly, silicon is employed for the substrate 201. Since a driver and a logic circuit for controlling the discharge energy generating element are produced by an ordinary semiconductor manufacturing process, the use of silicon for the substrate is advantageous. In the present embodiment, there was prepared silicon substrate bearing an electrothermal converting element (a heater composed of $HfB_2$) as the ink discharge pressure generating element 202, and a deposition film of SiN+Ta (not shown) in portions for forming an ink flow path and a nozzle.

Then, on the substrate bearing the ink discharge pressure generating element 202, a positive-working resist layer is formed, and is patterned to form a flow path pattern 203. As the positive-working resist, there was employed a following photodegradable positive-working resist:

A radical polymer of methacrylic anhydride;

weight-averaged molecular weight (Mw: converted to polystyrene)=25,000 degree of dispersion (Mw/Mn)=2.3.

This resin in powder state was dissolved with a solid concentration of about 30 wt. % in cyclohexanone and was used as a resist solution. The resist solution had a viscosity of 630 cps. This resist solution was coated by a spin coating method, then prebaked for 3 minutes at 120° C., and was heat treated for 60 minutes at 250° C. in a nitrogen atmosphere in an oven. The resist layer after the heat treatment had a thickness of 12 μm. Subsequently it was exposed to a deep-UV llight of a wavelength of 200 to 280 nm with an exposure amount of 4,000 $mJ/cm^2$ and was developed with a developing liquid of a following composition to obtain a flow path pattern 203:

| | |
|---|---|
| diethylene glycol monobutyl ether | 60 vol. % |
| ethanolamine | 5 vol. % |
| morpholine | 20 vol. % |
| ion-exchanged water | 10 vol. % |

The exposure and the development were conducted under following conditions.

Then a photosensitive resin composition of a following composition was spin coated on the processed substrate (film thickness of 20 μm on the substrate), and was baked for 2 minutes at 100° C. (hot plate) to form a liquid flow path structure material 207:

| | |
|---|---|
| EHPE (Diacel Chemical Industries Ltd.) | 100 parts by weight |
| 1,4 HFAB (Central Glass Co.) | 20 parts by weight |
| SP-170 (Asahi Denka Industries Co.) | 2 parts by weight |
| A-187 (Nihon Unicar Inc.) | 5 parts by weight |
| Methyl isobutyl ketone | 100 parts by weight |
| Diglyme | 100 parts by weight |

Subsequently a photosensitive resin composition of a following composition was spin coated on the processed substrate so as to obtain a film thickness of 1 μm, and was baked for 3 minutes at 80° C. (hot plate) to form an ink repellent layer:

| | |
|---|---|
| EHPE (Daicel Chemical Industries Ltd.) | 35 parts by weight |
| 2,2-bis(4-glycidyloxyphenyl)hexafluoropropane | 25 parts by weight |
| 1,4-bis(2-hydroxyhexafluoroisopropyl)benzene | 25 parts by weight |
| 3-(2-perfluorohexyl)ethoxy-1,2-epoxypropane | 16 parts by weight |
| A-187 (Nihon Unicar Inc.) | 4 parts by weight |
| SP-170 (Asahi Denka Industries Co.) | 2 parts by weight |
| Diethylene glycol monoethyl ether | 100 parts by weight |

Then the liquid flow path structure material 207 and the ink repellent layer were patterned by a pattern exposure by MPA-600 (manufactured by Canon Inc.) with a light of a wavelength of 290 to 400 nm and with an exposure amount of 400 $mJ/cm^2$, then a post-exposure bake for 120 seconds at 120° C. on a hot plate and a development with methyl isobutyl ketone to form an ink discharge port 209. In the present embodiment, there was formed a discharge port pattern of a diameter of 10 μm.

Then, on the rear surface of the processed substrate, an etching mask having an aperture of a width of 1 mm and a length of 10 mm was prepared with a polyetheramide composition (HIMAL, manufactured by Hitachi Chemical Co.). Then the substrate was subjected to an anisotropic etching by immersion in a 22 wt. % TMAH aqueous solution maintained at 80° C., thereby forming an ink supply aperture 210. In this operation, in order to protect the water repellent layer 5 (which also repels ink) from the etching solution, the anisotropic etching was conducted after coating a protective film (OBC manufactured by Tokyo Oka Industries Co.; not shown) on the ink repellent layer.

Then, after the OBC employed as the protective film was removed by dissolution with xylene, a flush exposure was executed with the light of a wavelength of 200 to 280 nm and with an exposure amount of 80,000 $mJ/cm^2$ through the nozzle constituting member and the ink repellent layer, thereby solubilizing the flow path pattern 203. Subsequently the substrate was immersed in methyl lactate under an application of ultrasonic vibration to remove the flow path pattern, whereby an ink jet head was prepared. The polyethylamide resin composition, employed as the etching mask was removed by dry etching with oxygen plasma.

The ink jet head thus prepared was mounted on a printer and subjected to an evaluation of discharge and recording, in which a satisfactory image recording was possible.

Embodiment 7

An ink jet head was prepared in the same manner as in the embodiment 6 except that a following photodegradable positive-working resist was employed, and was subjected to an evaluation of discharge and recording, in which a satisfactory image recording was possible:

A methacrylic anhydride/methyl methacrylate radical copolymer (monomer composition molar ratio 10/90);

weight-averaged molecular weight (Mw: converted to polystyrene)=28,000 degree of dispersion (Mw/Mn)=3.3.

Embodiment 8

An ink jet head was prepared in the same manner as in the embodiment 6 except that a following photodegradable positive-working resist was employed, and was subjected to an evaluation of discharge and recording, in which a satisfactory image recording was possible:

A methacrylic anhydride/methyl methacrylate/methacrylic acid radical copolymer (monomer composition molar ratio 10/85/5);

weight-averaged molecular weight (Mw: converted to polystyrene)=31,000 degree of dispersion (Mw/Mn)=3.5.

As explained in the foregoing, the present invention provides following effects:

1) Since the principal steps for producing a liquid discharge head are executed by a photolithographic technology utilizing a photoresist, a photosensitive dry film etc., it is not only possible to produce the detailed part of the liquid flow path structured member of the liquid discharge head with a desired pattern and in an extremely easy manner, but also to produce a plurality of the liquid discharge heads of a same configuration at the same time;

2) It is possible to partially alter the thickness of the liquid flow path structure material layer, thereby providing a liquid discharge head of a high mechanical strength;

3) There can be produced a liquid discharge head with a high discharge speed and with an extremely high precision of liquid droplet landing, so that a recording of a high image quality can be realized;

4) A liquid discharge head with high-density multi-array nozzles can be obtained by a simple method; and 5) The use of a thermally crosslinkable positive-working resist allows to set process conditions of an extremely wide process margins, thereby producing the liquid discharge heads with a high production yield.

What is claimed is:

1. A method for producing a fine hollow structured member on a substrate comprising:

a step of forming a positive-working photosensitive material layer on a substrate;

a step of heating said positive-working photosensitive material layer thereby crosslinking said positive-working photosensitive material layer;

a step of executing an irradiation with an ionizing radiation of a first wavelength region capable of decomposing said crosslinked positive-working photosensitive material layer on a predetermined area of said crosslinked positive-working photosensitive material layer; and a step of removing, by a development, the area irradiated by the ionizing radiation of said crosslinked positive-working photosensitive material layer from the substrate, thereby obtaining a mold pattern formed by a non-irradiated area by the ionizing radiation of said crosslinked positive-working photosensitive material layer;

a step of forming a covering resin layer, formed by a negative-working photosensitive material sensitive to a second wavelength region, in a position covering at least a part of the mold pattern on said substrate;

a step of irradiating said covering resin layer with an ionizing radiation of the second wavelength region thereby hardening said covering resin layer; and a step of removing, by dissolution, the mold pattern covered by said hardened covering resin layer from the substrate thereby obtaining a hollow structure corresponding to said mold pattern;

wherein said positive-working photosensitive material layer includes a ternary copolymer containing methyl methacrylate as a main component, methacrylic acid as a thermally crosslinkable factor and a factor for expanding a sensitivity region for said ionizing radiation; and said first wavelength region and said second wavelength region do not overlap mutually.

2. A method for producing a fine hollow structured member according to claim 1, wherein the crosslinking by said heat treatment is caused by a dehydration condensation reaction.

3. A method for producing a fine hollow structured member according to claim 1, wherein said factor for expanding the sensitivity region is methacrylic anhydride.

4. A method for producing a fine hollow structured member according to claim 3, wherein said ternary copolymer includes methacrylic acid in a proportion of 2 to 30 wt. % with respect to said copolymer, and is prepared by a radical polymerization of cyclized polymerization type at a temperature of 100 to 120° C. employing an azo compound or a peroxide as a polymerization initiator.

5. A method for producing a fine hollow structured member according to claim 3, wherein said ternary copolymer has a weight-averaged molecular weight within a range from 5,000 to 50,000.

6. A method for producing a fine hollow structured member according to claim 1, wherein said factor for expanding the sensitivity region is glycidyl methacrylate represented by a following formula:

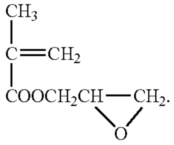

7. A method for producing a fine hollow structured member according to claim 6, wherein said ternary copolymer includes methacrylic acid in a proportion of 2 to 30 wt. % with respect to said copolymer, and is prepared by a radical polymerization at a temperature of 60 to 80° C. employing an azo compound or a peroxide as a polymerization initiator.

8. A method for producing a fine hollow structured member according to claim 6, wherein said ternary copolymer has a weight-averaged molecular weight within a range from 5,000 to 50,000.

9. A method for producing a fine hollow structured member according to claim 1, wherein said factor for expanding the sensitivity region is methyl 3-oxyimino-2-butanone methacrylate represented by a following formula:

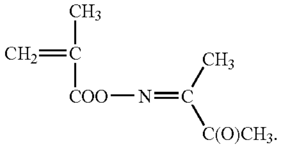

10. A method for producing a fine hollow structured member according to claim 9, wherein said ternary copolymer includes methacrylic acid in a proportion of 2 to 30 wt. % with respect to said copolymer, and is prepared by a radical polymerization at a temperature of 60 to 80° C. employing an azo compound or a peroxide as a polymerization initiator.

11. A method for producing a fine hollow structured member according to claim 9, wherein said ternary copolymer has a weight-averaged molecular weight within a range from 5,000 to 50,000.

12. A method for producing a fine hollow structured member according to claim 1, wherein said factor for expanding the sensitivity region is methacrylonitrile represented by a following formula:

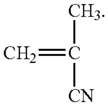

13. A method for producing a fine hollow structured member according to claim 12, wherein said ternary copolymer includes methacrylic acid in a proportion of 2 to 30 wt. % with respect to said copolymer, and is prepared by a radical polymerization at a temperature of 60 to 80° C. employing an azo compound or a peroxide as a polymerization initiator.

14. A method for producing a fine hollow structured member according to claim 12, wherein said ternary copolymer has a weight-averaged molecular weight within a range from 5,000 to 50,000.

15. A method for producing a fine hollow structured member according to claim 1, wherein said factor for expanding the sensitivity region is fumaric anhydride represented by a following formula:

16. A method for producing a fine hollow structured member according to claim 15, wherein said ternary copolymer includes methacrylic acid in a proportion of 2 to 30 wt. % with respect to said copolymer, and is prepared by a radical polymerization at a temperature of 60 to 8° C. employing an azo compound or a peroxide as a polymerization initiator.

17. A method for producing a fine hollow structured member according to claim 15, wherein said ternary copolymer has a weight-averaged molecular weight within a range from 5,000 to 50,000.

18. A method for producing a fine hollow structured member according to claim 1, wherein a positive-working photosensitive material includes a photodegradable resin having at least a carboxylic acid anhydride structure.

19. A method for producing a fine hollow structured member according to claim 18, wherein the positive-working photosensitive material is an acrylic resin which is subjected to an intermolecular crosslinking through the carboxylic acid anhydride structure.

20. A method for producing a fine hollow structured member according to claim 19, wherein the positive-working photosensitive material is an acrylic resin having an unsaturated bonding in a side chain.

21. A method for producing a fine hollow structured member according to claim 19, wherein the positive-working photosensitive material includes a structural unit represented by following general formulas 1 and 2:

general formula 1

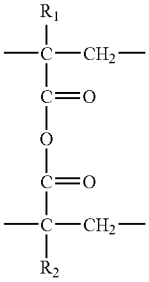

-continued general formula 2

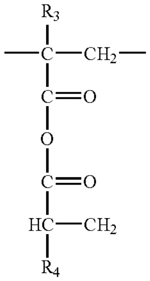

wherein $R_1$ to $R_4$, which may be mutually same or different, each represents a hydrogen atom or an alkyl group with 1 to 3 carbon atoms.

22. A method for producing a fine hollow structured member according to claim 21, wherein the first positive-working photosensitive material includes a structural unit represented by a following general formula 3:

general formula 3

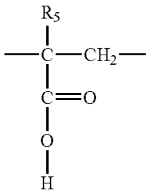

wherein $R_5$ represents a hydrogen atom or an alkyl group with 1 to 3 carbon atoms.

23. A method for producing a fine hollow structured member according to claim 1, wherein the first wavelength region is of a shorter wavelength than the second wavelength region.

24. A method for producing a fine hollow structured member according to claim 1, wherein said negative-working photosensitive material includes an epoxy resin as a principal component.

25. A method for producing a liquid discharge head comprising steps of forming a mold pattern with a removable resin in a portion where a liquid flow path is to be formed on a substrate on which a liquid discharge energy generating element is formed; coating and hardening a covering resin layer on said substrate so as to cover said mold pattern; and removing by dissolution said mold pattern thereby forming a liquid flow path having a hollow structure;

wherein said liquid flow path is formed by a method for producing a fine hollow structure according to claim 1.

26. A method for producing a liquid discharge head according to claim 25, wherein a developing liquid containing at least:

1) a glycol ether having 6 or more carbon atoms and miscible with water in an arbitrary ratio;
2) a nitrogen-containing basic organic solvent; and
3) water is used for developing said mold pattern.

27. A method for producing a liquid discharge head according to claim 26, wherein said glycol ether is ethylene glycol monobutyl ether and/or diethylene glycol monobutyl ether.

28. A method for producing a liquid discharge head according to claim 27, wherein said nitrogen-containing solvent is ethanolamine and/or morpholine.

* * * * *